(12) United States Patent
Furukawa et al.

(10) Patent No.: US 7,655,993 B2
(45) Date of Patent: Feb. 2, 2010

(54) METHOD FOR MANUFACTURING SEMICONDUCTOR INTEGRATED CIRCUIT DEVICE

(75) Inventors: Ryoichi Furukawa, Ome (JP); Satoshi Sakai, Yokohama (JP); Satoshi Yamamoto, Ome (JP)

(73) Assignee: Renesas Technology Corporation, Tokyo (JP)

( * ) Notice: Subject to any disclaimer, the term of this patent is extended or adjusted under 35 U.S.C. 154(b) by 255 days.

(21) Appl. No.: 11/738,741

(22) Filed: Apr. 23, 2007

(65) Prior Publication Data

US 2007/0187764 A1 Aug. 16, 2007

Related U.S. Application Data

(62) Division of application No. 10/968,050, filed on Oct. 20, 2004, now Pat. No. 7,217,607, which is a division of application No. 10/699,690, filed on Nov. 4, 2003, now Pat. No. 6,909,133, which is a division of application No. 10/288,539, filed on Nov. 6, 2002, now Pat. No. 6,660,597.

(30) Foreign Application Priority Data

Nov. 15, 2001 (JP) ............................. 2001-350636

(51) Int. Cl.
 *H01L 21/336* (2006.01)
(52) U.S. Cl. ...................... 257/410; 257/500; 257/411; 257/406; 257/E21.675
(58) Field of Classification Search ................. 257/410, 257/500, 411, 406, E21.675
See application file for complete search history.

(56) References Cited

U.S. PATENT DOCUMENTS 5,396,084 A * 3/1995 Matsumoto ................. 257/72

(Continued)

FOREIGN PATENT DOCUMENTS

JP 11-330460 11/1999

(Continued)

OTHER PUBLICATIONS

Official Action for Japanese Application No. 2001-350636, dated Dec. 18, 2007.

(Continued)

*Primary Examiner*—Eugene Lee
(74) *Attorney, Agent, or Firm*—Antonelli, Terry, Stout & Kraus, LLP.

(57) ABSTRACT

In a process of forming MISFETs that have gate insulating films that are mutually different in thickness on the same substrate, the formation of an undesirable natural oxide film at the interface between the semiconductor substrate and the gate insulating film is suppressed. A gate insulating film of MISFETs constituting an internal circuit is comprised of a silicon oxynitride film. Another gate insulating film of MISFETs constituting an I/O circuit is comprised of a laminated silicon oxynitride film and a high dielectric film. A process of forming the two types of gate insulating films on the substrate is continuously carried out in a treatment apparatus of a multi-chamber system. Accordingly, the substrate will not be exposed to air. Therefore, it is possible to suppress the inclusion of undesirable foreign matter and the formation of a natural oxide film at the interface between the substrate and the gate insulating films.

12 Claims, 17 Drawing Sheets

U.S. PATENT DOCUMENTS

| | | | |
|---|---|---|---|
| 5,480,828 A * | 1/1996 | Hsu et al. | 438/275 |
| 5,516,706 A | 5/1996 | Kusakabe | |
| 5,576,570 A * | 11/1996 | Ohsawa et al. | 257/369 |
| 5,960,289 A | 9/1999 | Tsui et al. | |
| 6,033,943 A * | 3/2000 | Gardner | 438/199 |
| 6,037,222 A | 3/2000 | Huang et al. | |
| 6,165,825 A | 12/2000 | Odake | |
| 6,194,257 B1 | 2/2001 | Kwon | |
| 6,383,873 B1 * | 5/2002 | Hegde et al. | 438/287 |
| 6,388,298 B1 * | 5/2002 | Gardner et al. | 257/408 |
| 6,407,435 B1 * | 6/2002 | Ma et al. | 257/411 |
| 6,417,052 B1 | 7/2002 | Tsujikawa et al. | |
| 6,524,910 B1 | 2/2003 | Lin et al. | |
| 6,562,718 B1 * | 5/2003 | Xiang et al. | 438/682 |
| 6,593,229 B1 | 7/2003 | Yamamoto et al. | |
| 6,660,597 B2 | 12/2003 | Furukawa et al. | |
| 6,713,353 B1 | 3/2004 | Kanda et al. | |
| 6,713,846 B1 * | 3/2004 | Senzaki | 257/635 |
| 6,911,707 B2 | 6/2005 | Gardner et al. | |

FOREIGN PATENT DOCUMENTS

| | | |
|---|---|---|
| JP | 2000-188338 | 7/2000 |
| JP | 2000-307083 | 11/2000 |
| JP | 2000-349285 | 12/2000 |
| JP | 2001-15612 | 1/2001 |
| JP | 2001-127280 | 5/2001 |
| JP | 2001-217415 | 8/2001 |
| JP | 2001-267591 | 9/2001 |
| JP | 2001-284463 | 10/2001 |
| JP | 2001-298095 | 10/2001 |
| JP | 2001-308198 | 11/2001 |

OTHER PUBLICATIONS

Official Action for Japanese Application No. 2001-350636, dated Sep. 4, 2007.

Fig. 4(e) of JP No. 2001-284463 with indication in English.

Fig. 2(f) of JP No. 2001-298095 with indication in English.

* cited by examiner

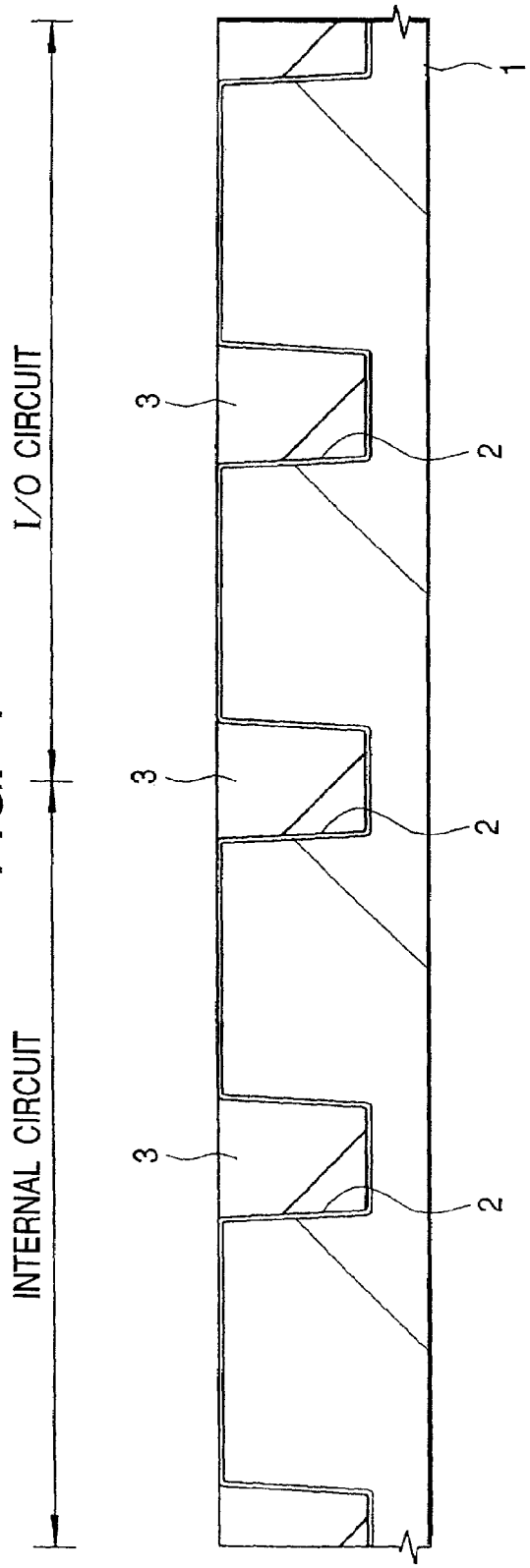
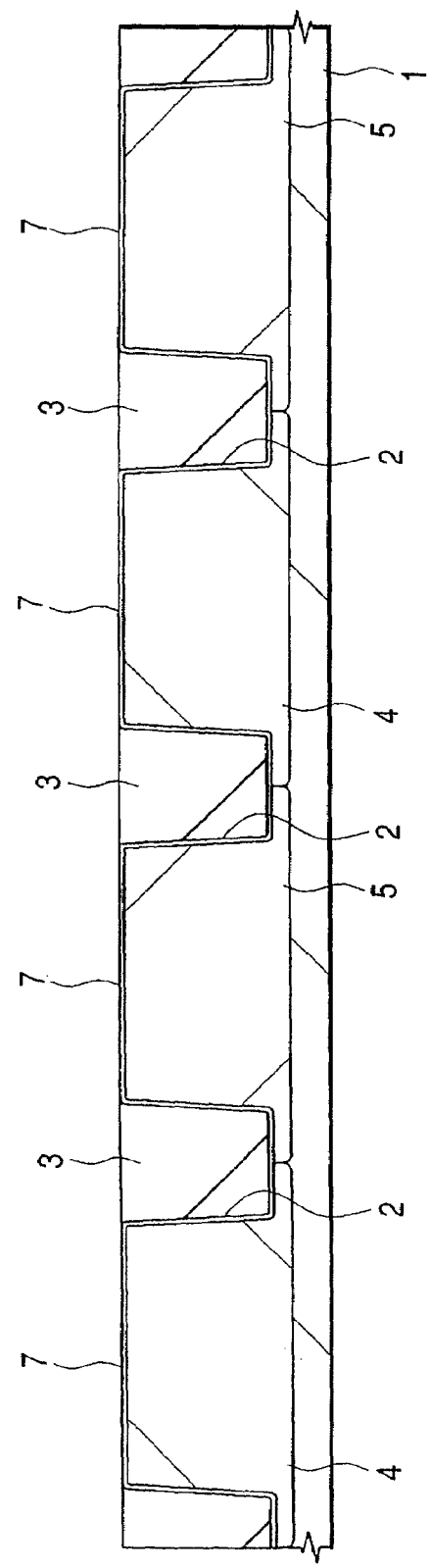

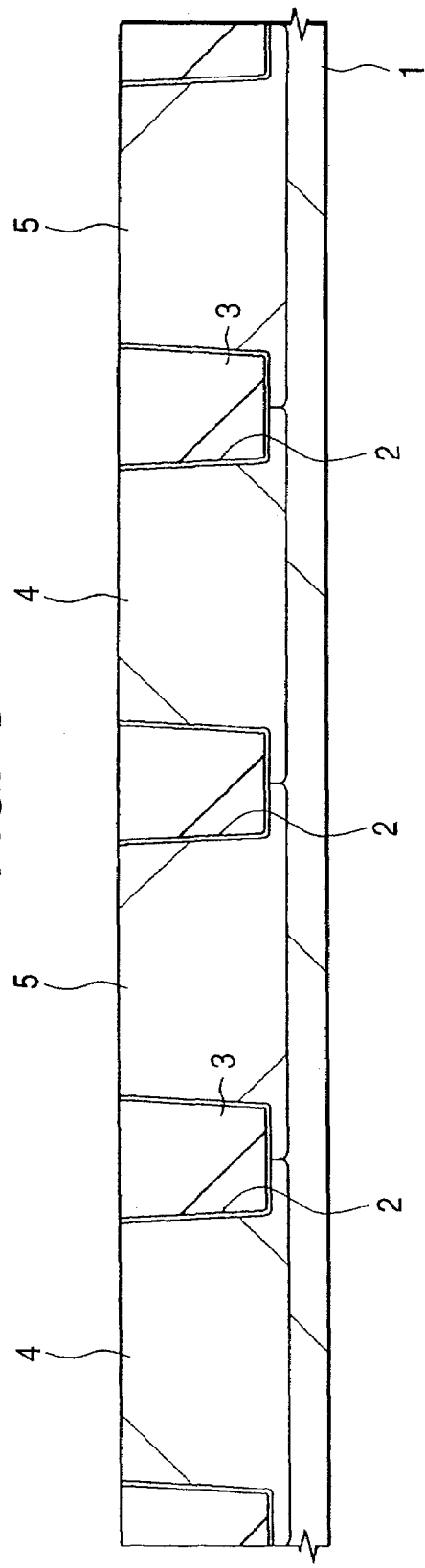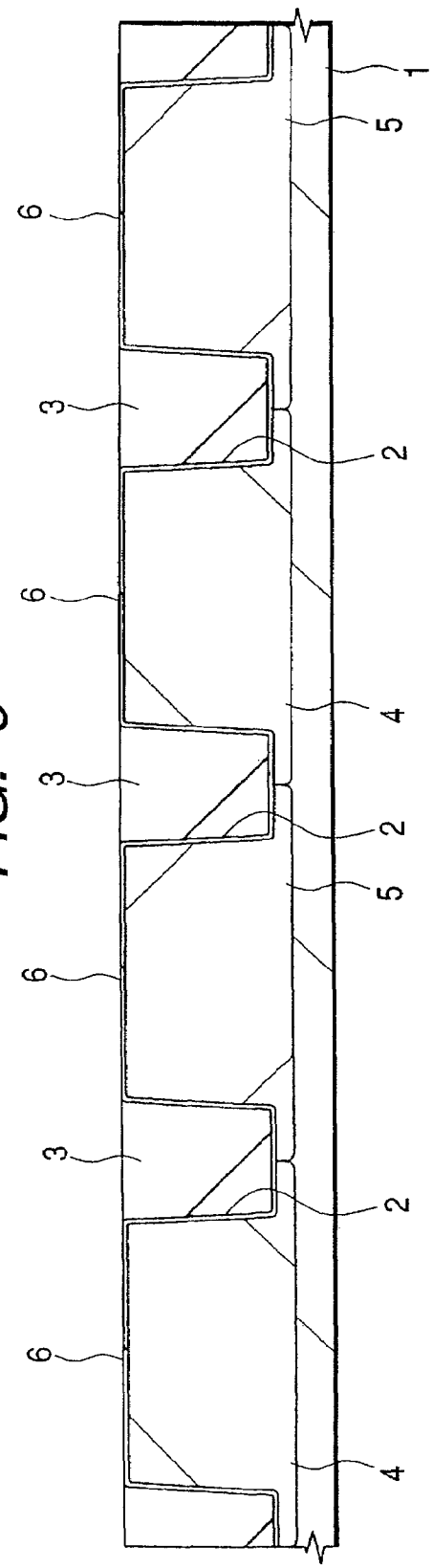

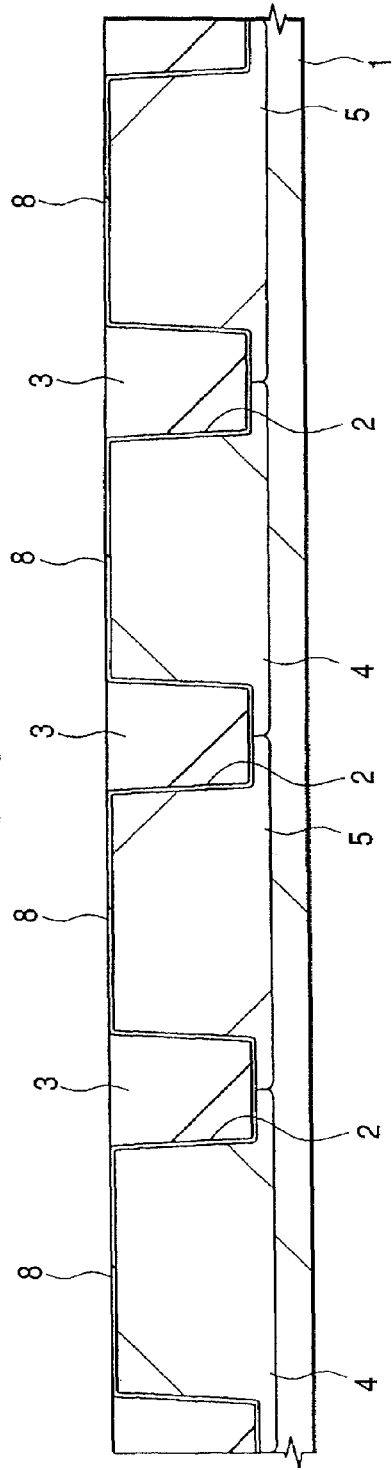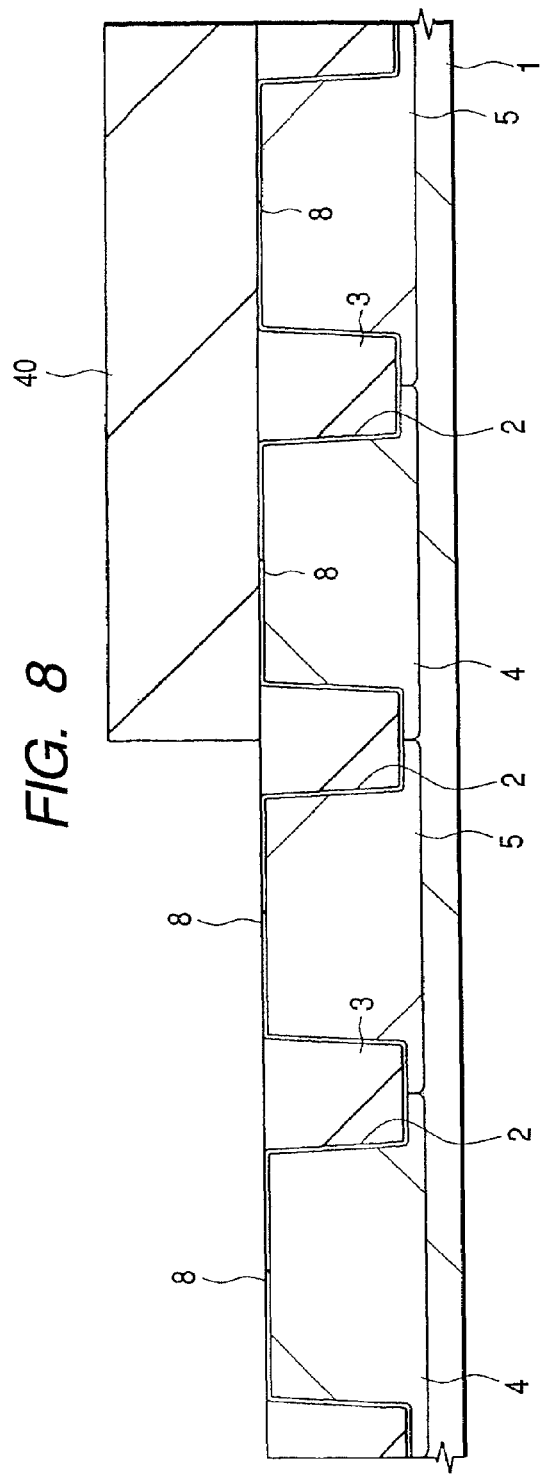

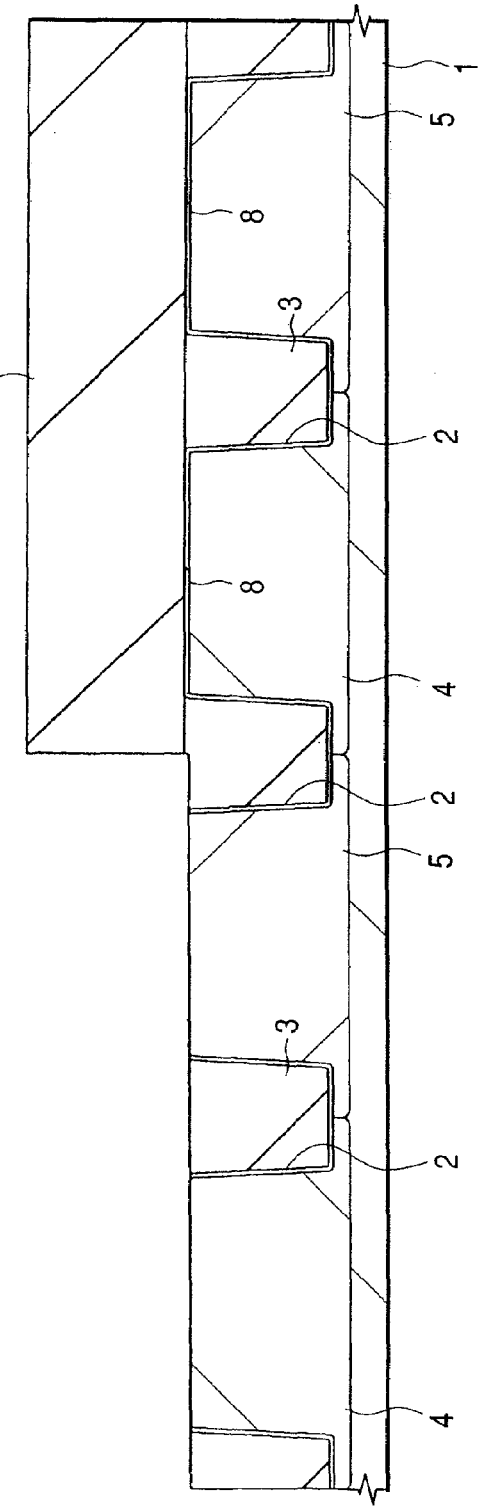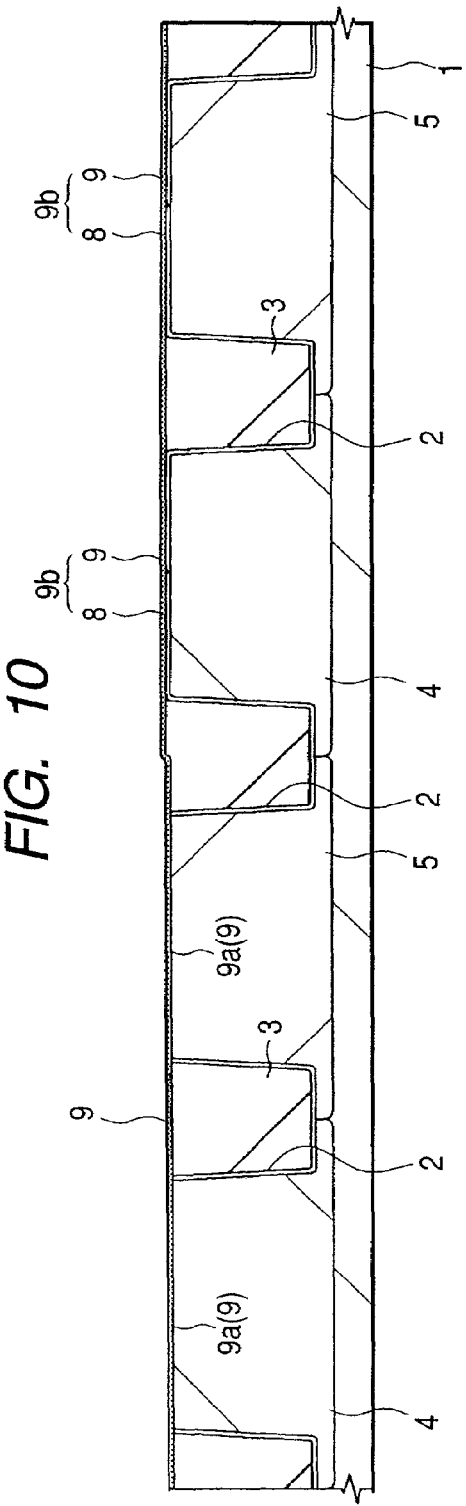

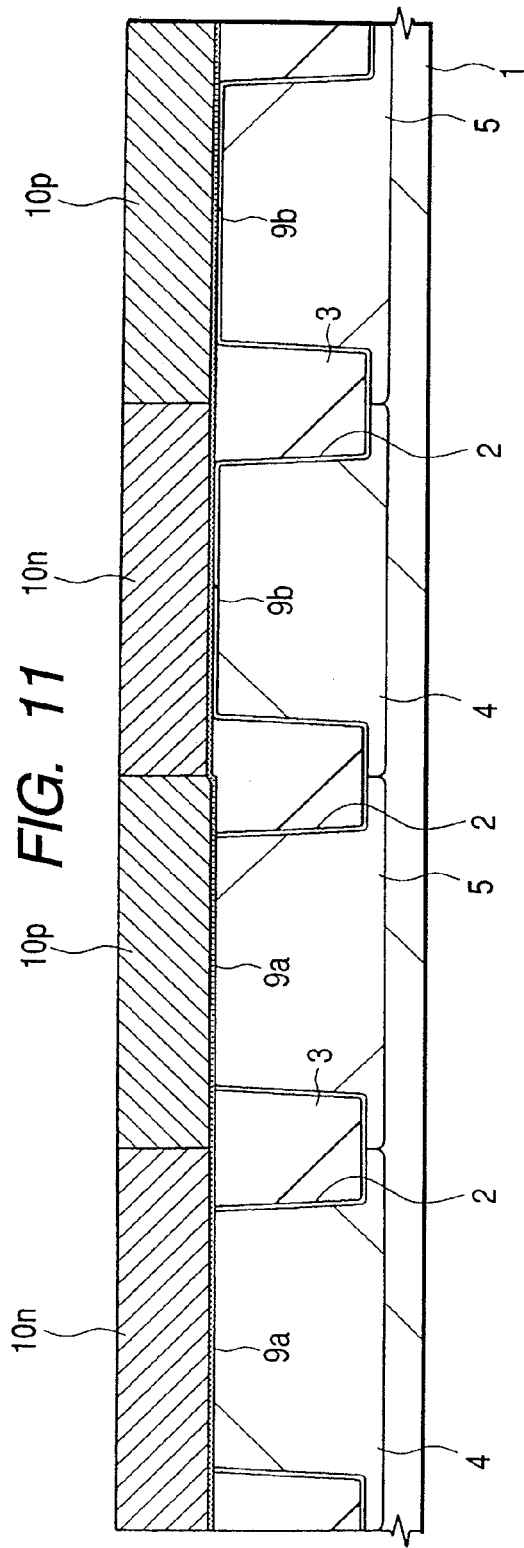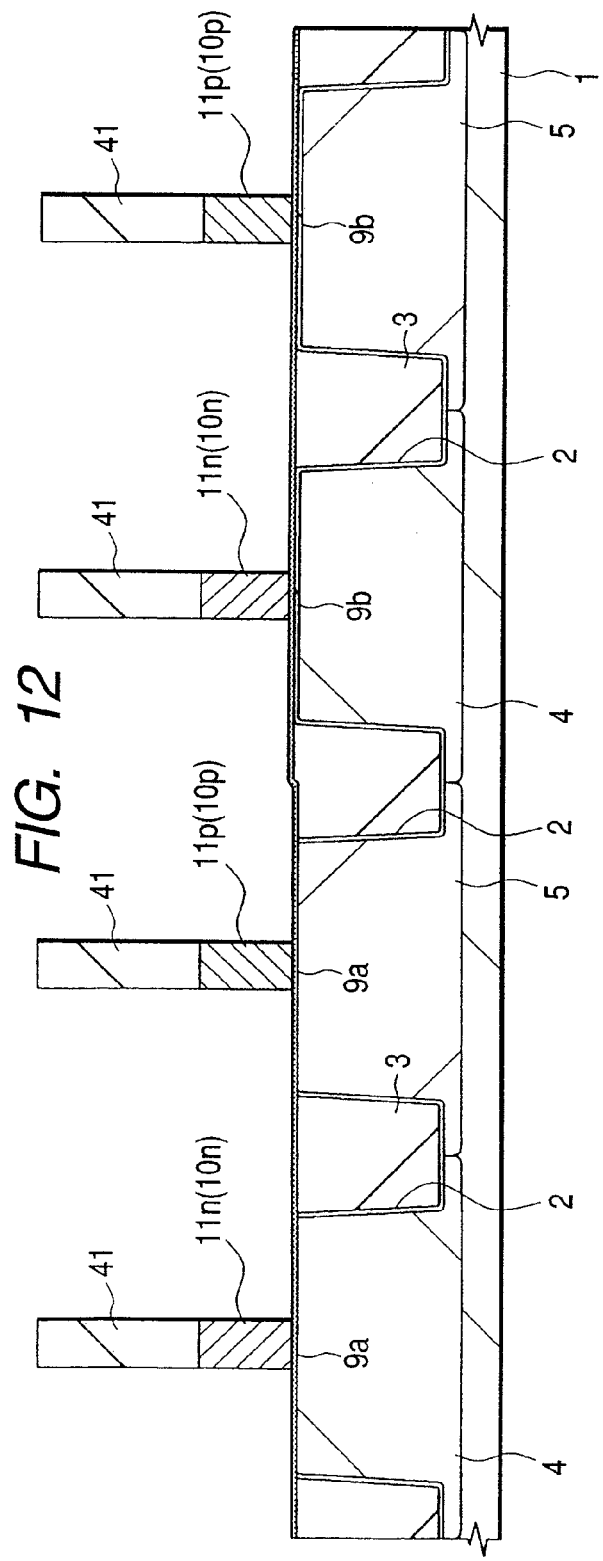

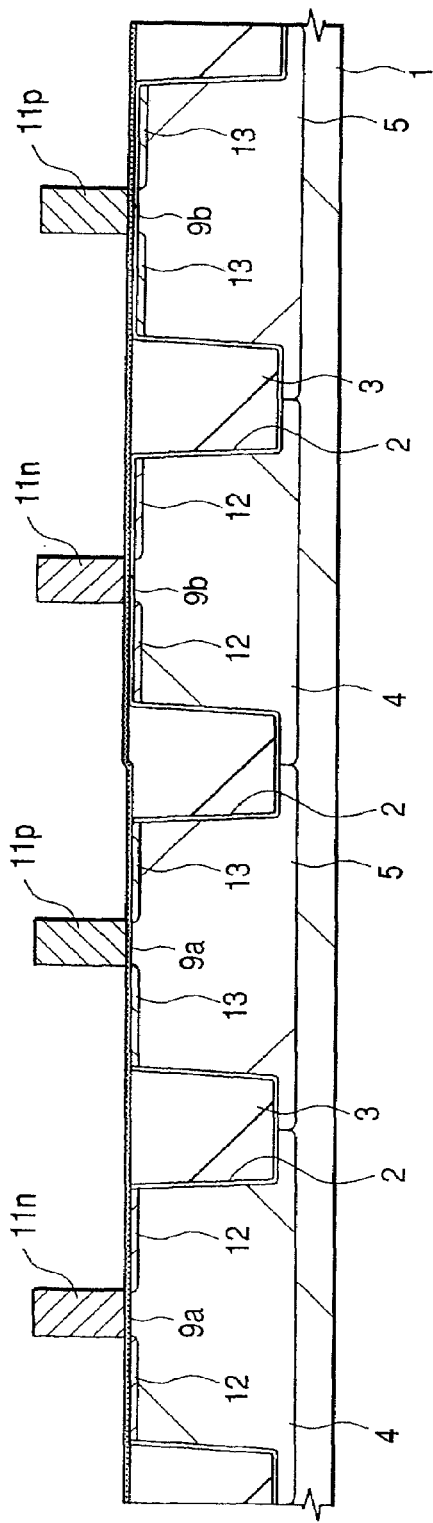
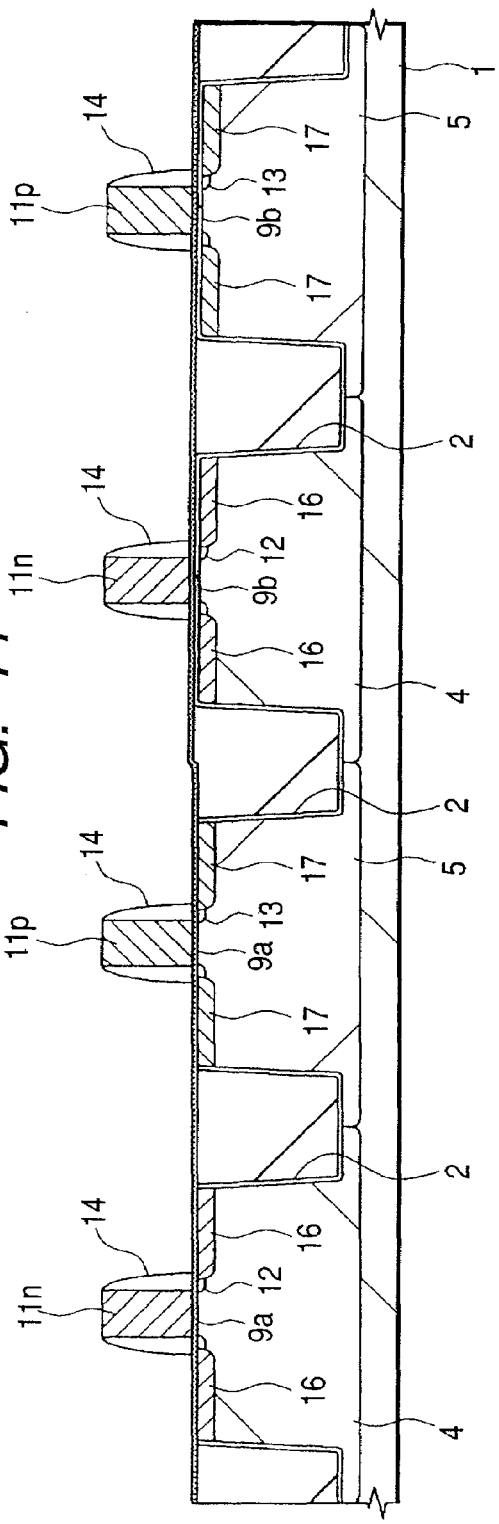

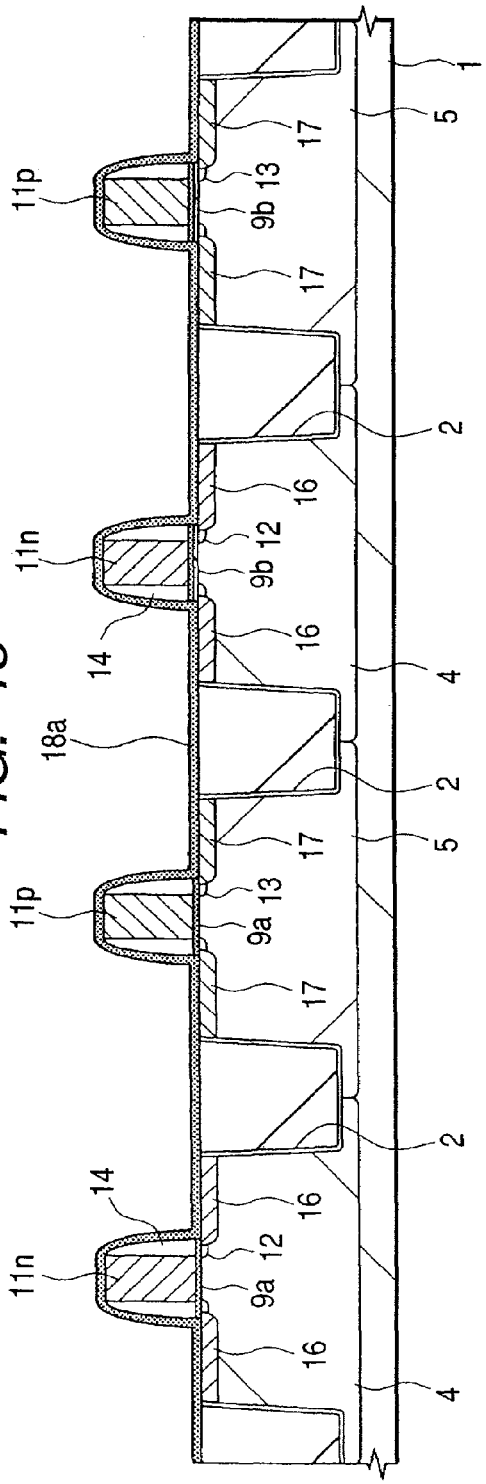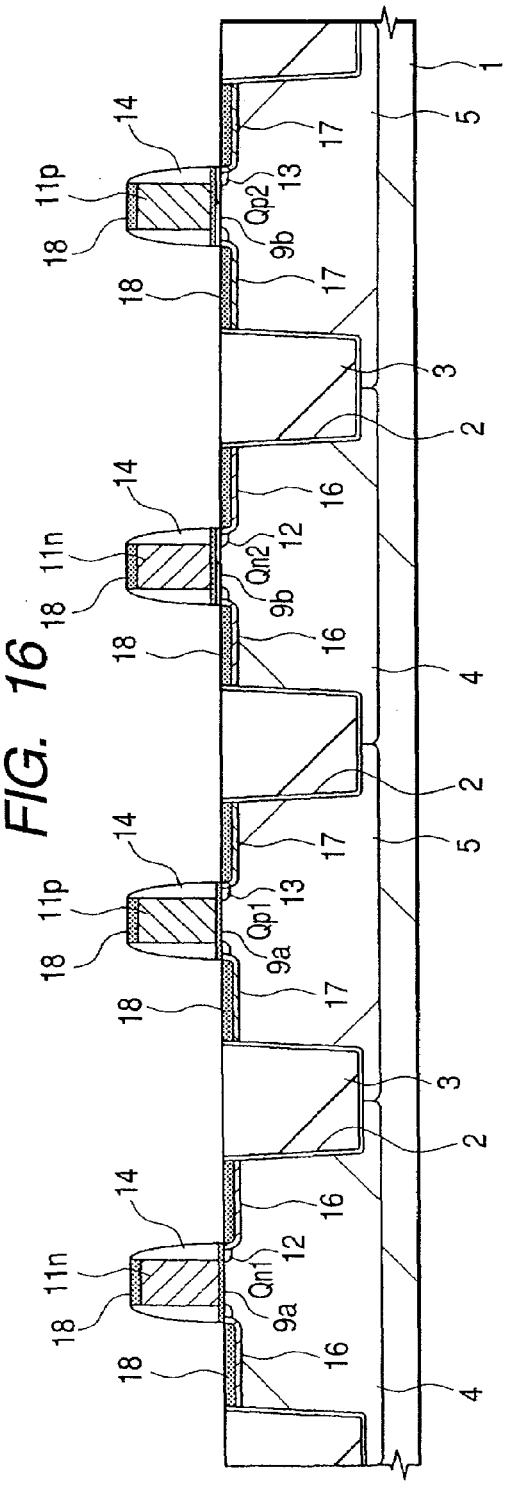

METHOD FOR MANUFACTURING SEMICONDUCTOR INTEGRATED CIRCUIT DEVICE

CROSS REFERENCE TO RELATED APPLICATION

This application is a Divisional application of application Ser. No. 10/968,050, filed Oct. 20, 2004, now U.S. Pat. No. 7,217,607, which is a Divisional application of application Ser. No. 10/699,690, filed Nov. 4, 2003, now U.S. Pat. No. 6,909,133, which is a Divisional application of application Ser. No. 10/288,539, filed Nov. 6, 2002, now U.S. Pat. No. 6,660,597, the contents of which are incorporated herein by reference in their entirety.

BACKGROUND OF THE INVENTION

The present invention relates to a method of manufacturing a semiconductor integrated circuit device. More particularly, the present invention relates to a technique that is applicable to a semiconductor integrated circuit device in which two or more types of MISFETs (Metal Insulator Semiconductor Field Effect Transistors) have gate insulating films that are mutually different in thickness and are formed on the same semiconductor substrate.

The operating voltage of a semiconductor device has been reduced generation by generation in the development of semiconductor integrated circuits for achieving higher integration and a lower power consumption. Under such circumstances, a MISFET is reduced in size in accordance with a scaling law for maintaining and improving the device performance, so that the thickness of the gate insulating film is reduced at the same time. However, for example, with a CMOS logic LSI, or the like, the operating voltage is different between the internal circuit and the input/output circuit. For this reason, a MISFET in which the thickness of the gate insulating film is relatively larger is also required.

For such a reason, in a recent semiconductor device, efforts have been pursued to effect the introduction of a process of forming a plurality of types of MISFETs which have gate insulating films that are mutually different in thickness on the same substrate. For example, Japanese Published Unexamined Patent Application No. 2000-188338 discloses a process of separately forming a gate insulating film made of silicon dioxide in a first region of a semiconductor substrate and another gate insulating film made of silicon nitride or tantalum oxide in a second region thereof.

SUMMARY OF THE INVENTION

For example, a MISFET with a gate length of not more than 0.2 µm is required to have a gate insulating film having a small thickness of around 3 nm in terms of a silicon dioxide film. However, if the thickness of the gate insulating film using a silicon dioxide film is reduced down to about 3 nm, the direct tunneling current flowing through the gate insulating film increases, so that a gate leakage current at a level that is not negligible from the viewpoint of reducing the power consumption is generated. Therefore, a MISFET in which the gate insulating film is comprised of silicon dioxide imposes a limitation on the increase in gate insulating film capacitance for improving the current driving ability.

A conceivable alternative as a countermeasure to this problem is to increase the physical film thickness of the gate insulating film by using a high dielectric film of titanium dioxide ($TiO_2$), hafnium dioxide ($HfO_2$), or the like, which has a larger relative dielectric constant than that of silicon nitride.

Thus, for a semiconductor device in which MISFETs having gate insulating films that are mutually different in thickness are formed on the same substrate, a process of forming a part of the gate insulating film with a high dielectric film and forming another part thereof with a silicon dioxide film is required. However, with the foregoing semiconductor device manufacturing method, the surface of the semiconductor substrate is exposed to air between the time when the semiconductor substrate surface has been exposed and the time when a gate insulating film made of silicon nitride or tantalum oxide is formed. Accordingly, impurities (foreign matter), such as carbon (C) contained in the air, are deposited on the semiconductor substrate surface, unfavorably resulting in a reduction in the withstand voltage of the gate insulating film deposited thereon.

Further, by exposure of the semiconductor substrate surface to air, a natural oxide film is formed on the semiconductor substrate surface. Even if a high dielectric film is deposited thereon to form a gate insulating film, the gate insulating film capacitance is reduced. As a consequence, it becomes difficult to implement a high-performance MISFET having a high current driving ability.

It is an object of the present invention to provide a technique, in a process of forming a MISFET having a gate insulating film comprised of a high dielectric film on a semiconductor substrate, for suppressing the formation of an undesirable natural oxide film at the interface between the semiconductor substrate and the gate insulating film.

It is another object of the present invention to provide a technique, in a process of forming a MISFET having a gate insulating film comprised of a high dielectric film on a semiconductor substrate, for improving the withstand voltage of the gate insulating film.

The above and other objects and novel features of the present invention will be apparent from the following description in this specification and the accompanying drawings.

Out of the many aspects of the present invention disclosed in this application, a general outline of typical ones will be briefly described as follows.

A method of manufacturing a semiconductor integrated circuit device in accordance with the present invention, using a high dielectric film for a gate insulating film, includes: a step of removing a silicon dioxide film on the semiconductor substrate surface; a step of cleaning the semiconductor substrate surface; and a step of depositing a high dielectric film on the semiconductor substrate surface. With this method, the semiconductor substrate is held in an inert atmosphere between the time when the semiconductor substrate surface has been cleaned and when the high dielectric film is deposited. As a consequence, it is possible to prevent a reduction in the withstand voltage of the gate insulating film, and it is possible to improve the current driving ability by preventing the reduction in capacitance of the gate insulating film.

A method of manufacturing a semiconductor integrated circuit device in accordance with the present invention, includes the steps of: (a) preparing a silicon substrate having a first region and a second region on a principal surface; (b) removing a film including a natural oxide film formed on the principal surface of the silicon substrate, and thereby exposing a silicon layer on the principal surface of the silicon substrate; (c) forming, after the step (b), a first insulating film having a smaller relative dielectric constant than that of a silicon nitride film on the silicon layer; (d) selectively removing the first insulating film in the second region, leaving the first insulating film in the first region, and thereby exposing the silicon layer in the second region; (e) forming, after the step (d), a second insulating film having a larger relative dielectric constant than that of a silicon nitride film on the first insulating film in the first region and on the silicon layer in the second region; (f) forming a first conductive layer on the second insulating film; and (g) patterning the first conductive layer, and thereby forming a gate electrode of a first MISFET comprised of the first conductive layer on the second insulating film in the first region and forming a gate electrode of a second MISFET comprised of the first conductive layer on the second insulating film in the second region, wherein at least the steps (b) to (e) are continuously carried out without exposing the silicon substrate to air.

BRIEF DESCRIPTION OF THE DRAWINGS

FIG. 1 is a cross-sectional view of a part of a semiconductor substrate, illustrating a step in the method of manufacturing a MISFET according to one embodiment of the present invention;

FIG. 2 is a cross-sectional view of a part of the semiconductor substrate, illustrating a subsequent step in the method of manufacturing the MISFET according to the one embodiment of the present invention;

FIG. 5 is a cross-sectional view of a part of the semiconductor substrate, illustrating a subsequent step in the method of manufacturing the MISFET according to the one embodiment of the present invention;

FIG. 6 is a cross-sectional view of a part of the semiconductor substrate, illustrating a subsequent step in the method of manufacturing the MISFET according to the one embodiment of the present invention;

FIG. 7 is a cross-sectional view of a part of the semiconductor substrate, illustrating a subsequent step in the method of manufacturing the MISFET according to the one embodiment of the present invention;

FIG. 8 is a cross-sectional view of a part of the semiconductor substrate, illustrating a subsequent step in the method of manufacturing the MISFET according to the one embodiment of the present invention;

FIG. 9 is a cross-sectional view of a part of the semiconductor substrate, illustrating a subsequent step in the method of manufacturing the MISFET according to the one embodiment of the present invention;

FIG. 10 is a cross-sectional view of a part of the semiconductor substrate, illustrating a subsequent step in the method of manufacturing the MISFET according to the one embodiment of the present invention;

FIG. 11 is a cross-sectional view of a part of the semiconductor substrate, illustrating a subsequent step in the method of manufacturing the MISFET according to the one embodiment of the present invention;

FIG. 12 is a cross-sectional view of a part of the semiconductor substrate, illustrating a subsequent step in the method of manufacturing the MISFET according to the one embodiment of the present invention;

FIG. 13 is a cross-sectional view of a part of the semiconductor substrate, illustrating a subsequent step in the method of manufacturing the MISFET according to the one embodiment of the present invention;

FIG. 14 is a cross-sectional view of a part of the semiconductor substrate, illustrating a subsequent step in the method of manufacturing the MISFET according to the one embodiment of the present invention;

FIG. 15 is a cross-sectional view of a part of the semiconductor substrate, illustrating a subsequent step in the method for manufacturing the MISFET according to the one embodiment of the present invention;

FIG. 16 is a cross-sectional view of a part of the semiconductor substrate, illustrating a subsequent step in the method for manufacturing the MISFET according to the one embodiment of the present invention;

DETAILED DESCRIPTION OF THE PREFERRED EMBODIMENTS

Figure 3:
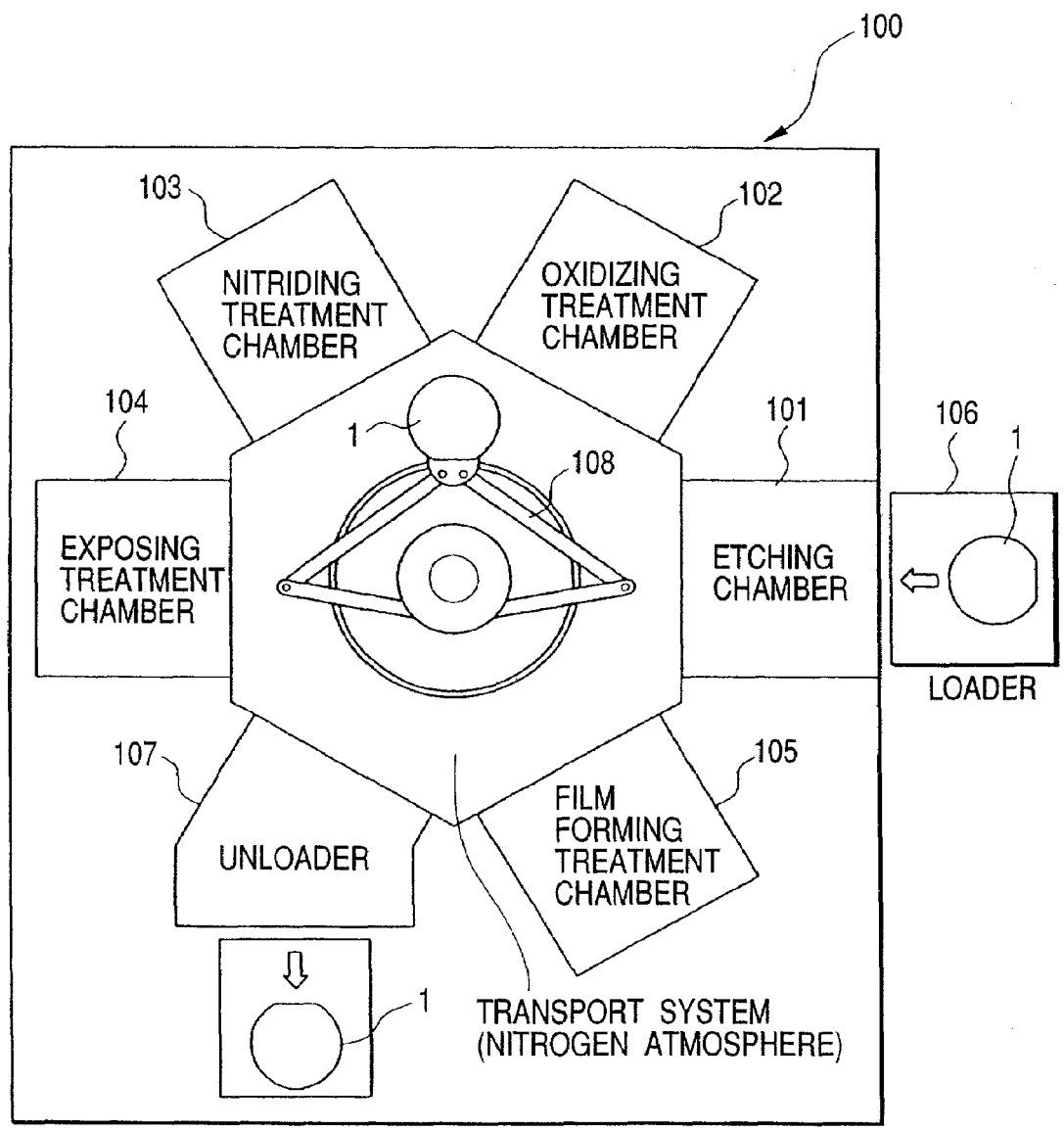
FIG. 3 is a schematic diagram of a treatment apparatus to be used for manufacturing a MISFET according to one embodiment of the present invention.

The present invention will be described specifically by way of various embodiments with reference to the accompanying drawings. Incidentally, throughout the drawings, those elements having the same function have been identified by the same reference numerals and characters, and a repeated description thereof has been omitted. Further, in the following description of the embodiments, the explanation of the same or similar parts will not be repeated in principle unless necessary.

Embodiment 1

With a CMOS-LSI according to this embodiment, a MISFET constituting the internal circuit is operated at a low voltage from the viewpoint of reducing the power consumption of the circuit. To this end, the gate insulating film of the MISFET constituting the internal circuit is comprised of a thin insulating film. On the other hand, for another MISFET of an input/output (I/O) circuit to be supplied with a high external voltage, it is necessary to ensure that there is a sufficient gate withstand voltage, and, hence, the gate insulating film is provided in the form of a thick insulating film.

A method for use in manufacturing the CMOS-LSI of this embodiment will be described with reference to FIGS. 1 to 19, step by step. Incidentally, the left-hand side region and the right-hand side region of each of the cross-sectional views (FIGS. 1, 2, and 5 to 19) of a semiconductor substrate, which illustrate the method of manufacturing the CMOS-LSI, represent the internal circuit region and the I/O region, respectively.

First, as shown in FIG. 1, an element isolation trench 2 is formed in a semiconductor substrate (referred to hereinafter as a substrate) 1 made of, for example, p-type single-crystal silicon having a specific resistance of about 1 to 10 Ωcm. The element isolation trench 2 is formed in the following manner. The substrate 1, within an element isolation region, is etched to form a trench. Then, a silicon dioxide film 3 is deposited on the substrate 1, including the inside of the trench, by a CVD method. Subsequently, the silicon dioxide film 3 outside the trench is removed by a chemical mechanical polishing method.

Then, as shown in FIG. 2, the substrate 1 is thermally oxidized to form a thin silicon dioxide film 7, having a thickness of not more than 10 nm, on its surface. Subsequently, boron is ion-implanted into a part of the substrate 1 via the silicon dioxide film 7, and phosphorus is ion-implanted into another part thereof. Thereafter, the substrate 1 is heat-treated to diffuse the impurities (boron and phosphorus) into the inside of the substrate 1. As a consequence, a p-type well 4 is formed in an n-channel type MISFET formation region, and an n-type well 5 is formed in a p-channel type MISFET formation region. Further, at this step, boron is ion-implanted into the surface of the p-type well 4 (channel formation region), and phosphorus is ion-implanted into the surface of the n-type well 5 (channel formation region) for controlling the threshold voltage of the MISFET.

Then, the substrate 1 is transported into a treatment apparatus 100, as shown in FIG. 3. The treatment apparatus 100 is made up of a multi-chamber system, including a plurality of treatment chambers comprising an etching chamber 101, an oxidizing treatment chamber 103, a nitriding treatment chamber 103, an exposing treatment chamber 104, and a film-forming treatment chamber 105, and a loader 106 and an unloader 107. At the central part of the treatment apparatus 100, there is disposed a transport system including a robot hand 108 for transporting in (transporting out) the substrate 1 in wafer form to (from) the foregoing respective treatment chambers. An inert gas, such as nitrogen or a rare gas, is filled inside the transport system. This allows the substrate 1 to be transported in (transported out) to (from) each chamber without contact with air.

The substrate 1 in wafer form that has been transported into the treatment apparatus 100 is first accommodated in the loader 106. Subsequently, gas replacement in the loader 106 is performed, and then the substrate 1 is fed into the etching chamber 101 via the transport system.

Figure 4:
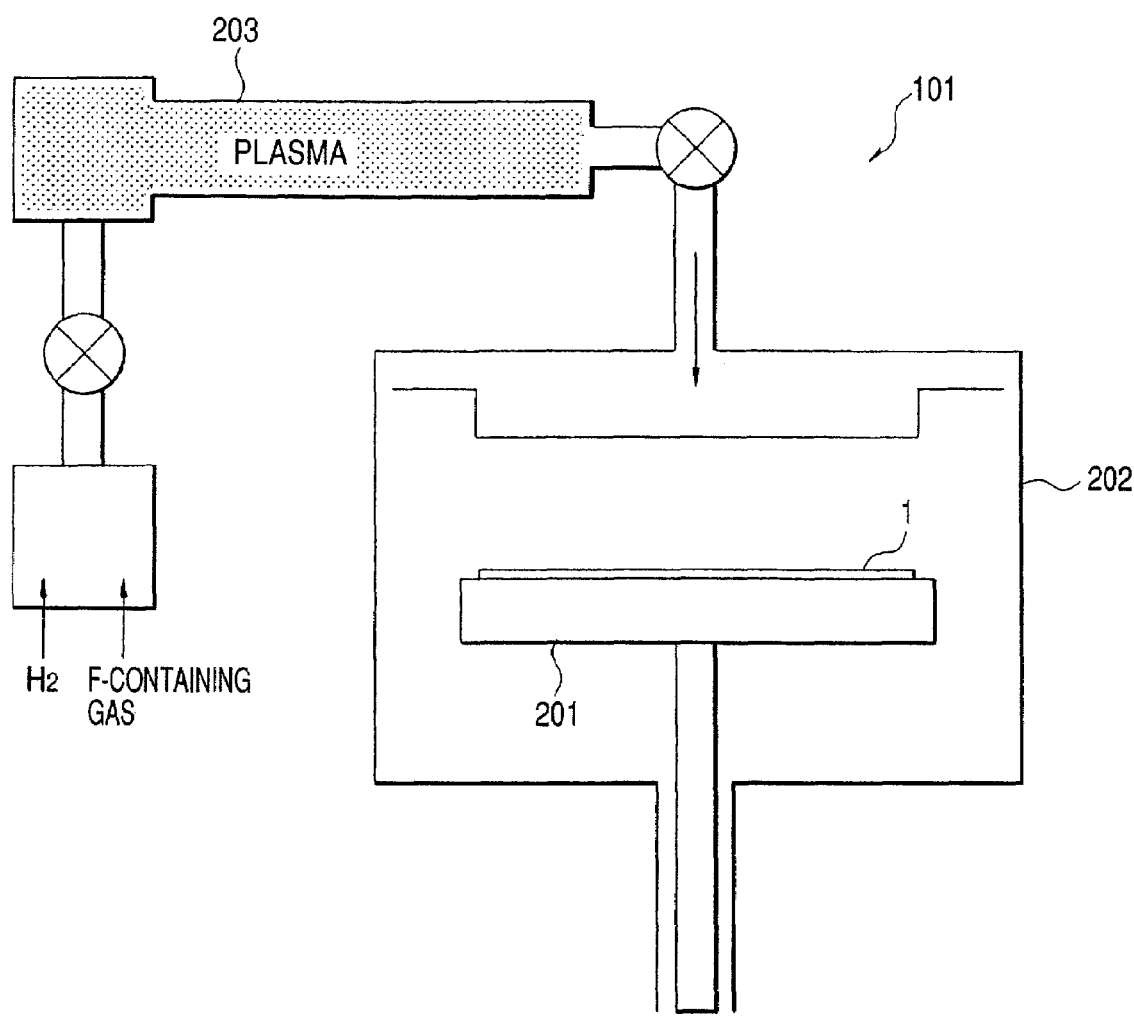
FIG. 4 is a schematic diagram showing a side view of the etching chamber of the treatment apparatus shown in FIG. 3.

As shown in FIG. 4, the etching chamber 101 is made up of a chamber 202, including a stage 201 for mounting the substrate 1 thereon, and a plasma generation unit 203 disposed outside the chamber 202. Thus, upon accommodation of the substrate 1 in the chamber 202, a fluorine-containing gas, or a mixed gas of a fluorine-containing gas and hydrogen, is supplied to the plasma generation unit 203. The gas is then decomposed by a plasma formed by a microwave or the like, thereby to form a fluorine radical, or a fluorine radical and a hydrogen radical. Thus, as shown in FIG. 5, the thin silicon dioxide film 7 that has been formed on the surface of the substrate 1 is decomposed and removed.

By decomposing and removing the silicon dioxide film 7 in the etching chamber 101, in which the plasma formation unit 203 is separated from the chamber 202 in this manner, the surface of the substrate 1 becomes less susceptible to plasma damage. Therefore, it is possible to suppress the fluctuations in characteristics of the elements due to a crystal defect, or the like. Incidentally, it is also possible to perform the process of removal of the silicon dioxide film 7 by wet etching using hydrogen fluoride, or the like. However, when a wet process is adopted, steps of pure water cleaning and drying of the substrate 1 are required after removing the silicon dioxide film 7. Therefore, as compared with the case where the foregoing dry process is adopted, it becomes difficult to implement the multi-chamber configuration during the transition from removal of the silicon dioxide film 7 to the subsequent step.

Then, the substrate 1, from which the silicon dioxide film 7 has been removed, is taken out from the etching chamber 101 and transported into the oxidizing treatment chamber 102. Then, the surface of the substrate 1 is wet oxidized in the oxidizing treatment chamber 102, thereby to form a silicon dioxide film 6 with a thickness of about 1 to 4 nm on the surface of the substrate 1 (the p-type well 4, the n-type well 5), as shown in FIG. 6. The resulting silicon dioxide film 6 is used as a part of the gate insulating film of the MISFET constituting the I/O circuit.

By performing the process from cleaning of the surface of the substrate 1 to formation of the silicon dioxide film (gate insulating film) 6, without exposing the substrate 1 to air in this manner, it is possible to minimize the thickness of the undesirable natural oxide film formed on the surface of the substrate 1 after removal of the silicon dioxide film 7. As a consequence, it is possible to obtain a silicon dioxide film (gate insulating film) 6 which is thin and of high quality.

Then, the substrate 1, on which the silicon dioxide film 6 has been formed is taken out from the oxidizing treatment chamber 102 and transported into the nitriding treatment chamber 103. The surface of the substrate 1 is then nitrided therein. As a result, as shown in FIG. 7, the silicon dioxide film 6 is nitrided to form a silicon oxynitride film 8. The nitriding treatment of the silicon dioxide film 6 is accomplished by, for example, supplying an ammonia ($NH_3$) gas into the nitriding treatment chamber 103 and quickly heating the substrate 1 up to about 900° C. by lamp annealing. It is also possible to perform the nitriding treatment by a plasma treatment using nitrogen as a source gas. In such a case, by using the etching chamber 101, wherein the chamber 202 for accommodating the substrate 1 therein is separated from the plasma generation unit 203 for generating a plasma, it is possible to reduce the damage to the substrate 1 due to the plasma.

The foregoing nitriding treatment is not an essential step. However, by changing the silicon dioxide film 6 into the silicon oxynitride film 8, the interface with a high dielectric film to be deposited on top of the silicon oxynitride film 8 in the subsequent step advantageously becomes less susceptible to oxidation.

Then, the substrate 1, on which the silicon oxynitride film 8 has been formed, is taken out from the nitriding treatment chamber 103 and transported into the exposing treatment chamber 104. Then, as shown in FIG. 8, a part of the surface (I/O circuit region) of the substrate 1 is covered with a photoresist film 40. Although not shown, inside the exposing treatment chamber 104, there are disposed a resist coating apparatus for spin-coating the surface of the substrate 1 with the photoresist film 40, an exposing apparatus for transferring a prescribed pattern onto the photoresist film 40 that has been coated on the surface of the substrate 1, a developing apparatus for developing the photoresist film 40 after completion of the exposing treatment, and an ashing apparatus for removing the photoresist film 40 on the surface of the substrate 1.

Then, the substrate 1, on which the photoresist film 40 has been formed, is taken out from the exposing treatment chamber 104 and transported into the etching chamber 101. As shown in FIG. 9, the silicon oxynitride film 8 in the region not covered with the photoresist film 40 (the internal circuit region) is then removed.

Subsequently, the substrate 1 is transported from the etching chamber 101 to the exposing treatment chamber 104, and the photoresist film 40 is removed by an ashing treatment. Thereafter, the resulting substrate 1 is transported into the film-forming treatment chamber 105. Then, as shown in FIG. 10, a high dielectric film 9, with a thickness in terms of silicon dioxide of about 2 nm to 5 nm, is deposited on the substrate 1. The resulting high dielectric film 9 is used as a gate insulating film of a MISFET constituting the internal circuit, and it is also used as a part of another gate insulating film of a MISFET constituting the I/O circuit.

Herein, the high dielectric film 9 is a film made of a material having a larger relative dielectric constant than that of silicon nitride. More specifically, it is a film made of a material having a relative dielectric constant of not less than 8.0. Examples of a material having such a high relative dielectric constant may include titanium dioxide ($TiO_2$), hafnium dioxide ($HfO_2$), alumina ($Al_2O_3$), zirconium dioxide ($ZrO_2$), and ruthenium dioxide ($RuO_2$). Further, it is also possible to use high dielectrics or ferroelectrics having a crystal structure of a perovskite type or a composite perovskite type, such as PZT, PLT, PLZT, $PbTiO_3$, $SrTiO_3$, $BaTiO_3$, BST, SBT, or $Ta_2O_5$. For the formation of the high dielectric film 9, a CVD method, a sputtering method, or an ALD (Atomic Layer Deposition) method is employed. However, when the high dielectric film 9 is a titanium dioxide film, deposition is performed by a CVD method (deposition temperature, about 400° C.) using tetraisopropoxy titanium ($Ti(iso-OC_3H_7)_4$) and oxygen as source gases.

In general, a high (ferro) dielectric film made of the foregoing metal oxide has crystal defects, such as oxygen loss, in the film immediately after deposition. For this reason, if it is used as a gate insulating film as it is, the gate withstand voltage may be reduced, or the leakage current may be increased. Thus, when there is such a possibility, a heat treatment for modifying and crystallizing the dielectric film 9 is performed. This heat treatment is performed in the following manner. First, the substrate 1 is transported into the oxidizing treatment chamber 102, and the substrate 1 is heat-treated in a high-temperature atmosphere containing oxygen. Then, the substrate 1 is transported into the nitriding treatment chamber 103, and the substrate 1 is heat-treated in a high-temperature atmosphere containing nitrogen. At this step, in order to minimize the possibility of the formation of an undesirable oxide at the interface between the high dielectric film 9 and the underlying substrate 1 (or silicon oxynitride film 8), it is desirable that the heat treatment in the oxidizing treatment chamber 102 is performed at a temperature that is reduced to as low a level as possible.

Through the steps up to this point, a thin gate insulating film 9a, comprised of the high dielectric film 9, is formed on the surface of the substrate 1 in the internal circuit region. Whereas, a thick gate insulating film 9b, comprised of a laminated film of the silicon oxynitride film 8 and the high dielectric film 9, is formed on the surface of the substrate 1 in the I/O region.

Thus, in this embodiment, when the two types of gate insulating films 9a and 9b, that are different from each other in thickness, are formed on the substrate 1, the foregoing treatment apparatus 100 is used, and a continuous treatment is performed without exposing the substrate 1 to air. As a consequence, it is possible to form high-quality gate insulating films 9a and 9b wherein the ratio of a natural oxide film component and the amount of foreign matter deposited are very small.

Then, as shown in FIG. 11, an n-type polycrystal silicon film 10n is formed on top of the p-type well 4, and a p-type polycrystal silicon film 10p is formed on top of the n-type well 5. These polycrystal silicon films (10n and 10p) are used as gate electrode materials of the MISFETs.

The polycrystal silicon films (10n and 10p) are formed in the following manner. On the substrate 1, a non-doped polycrystal silicon film is deposited by a CVD method. Subsequently, phosphorus is doped into the polycrystal silicon film on top of the p-type well 4, and boron is doped into the polycrystal silicon film on top of the n-type well 5 by an ion implantation method using a photoresist film as a mask.

For deposition of the foregoing non-doped polycrystal silicon film, the film-forming treatment chamber 105 of the treatment apparatus 100 may be used. Alternatively, a stand-alone CVD apparatus may also be used. When deposition is performed in the film-forming treatment chamber 105, the substrate 1 will not be exposed to air between the formation of the gate insulating films 9a and 9b and the deposition of the non-doped polycrystal silicon films. Therefore, it is possible to suppress the defects that result in undesired natural oxide films being formed on the surfaces of the gate insulating films 9a and 9b, and that result in foreign matter being deposited thereon.

Incidentally, as a matter of course, the gate electrode material may be comprised of a conductive film other than the foregoing polycrystal silicon films (10n and 10p), such as a silicon film containing Ge (germanium) in an amount of several percent to several tens percent, a laminated film (polycide film) of a polycrystal silicon film and a refractory metal silicide film, or a laminated film (polymetal film) of a polycrystal silicon film and a refractory metal film.

The steps which are carried out after the deposition of the polycrystal silicon films (10n and 10p) will be described briefly.

First, as shown in FIG. 12, the n-type polycrystal silicon film 10n and the p-type polysilicon film 10p are dry etched by using a photoresist film 41 as a mask. As a consequence, a gate electrode 11n, that is composed of the n-type polysilicon film 10n, is formed on top of the p-type well 4, and a gate electrode 11p, that is composed of the p-type polycrystal silicon film 10p, is formed on top of the n-type well 5.

Then, the photoresist film 41 is removed. Thereafter, as shown in FIG. 13, phosphorus or arsenic is ion-implanted into the portions of the p-type well 4 on the opposite sides of the gate electrode 11n to form n$^-$-type semiconductive regions 12 each with a low impurity concentration. Whereas, boron is ion-implanted into the portions of the n-type well 5 on the opposite sides of the gate electrode 11p to form p$^-$-type semiconductive regions 13, each with a low impurity concentration. The n$^-$-type semiconductive region 12 is formed for rendering the n-channel type MISFET into a LDD (lightly doped drain) structure. Whereas, the p$^-$-type semiconductive region 13 is formed for rendering the p-channel type MISFET into a LDD structure.

Then, as shown in FIG. 14, sidewall spacers 14 are formed on the sidewalls of the gate electrodes 11n and 11p. The sidewall spacers 14 are formed in the following manner. A silicon nitride film is deposited on the substrate 1 by a CVD method. Subsequently, the resulting silicon nitride film is anisotropically etched so as to be partially left on the sidewalls of the gate electrodes 11n and 11p. Then, phosphorus or arsenic is ion-implanted into the portions of the p-type well 4 on the opposite sides of the gate electrode 11n. Whereas, boron is ion-implanted into the portions of the n-type well 5 on the opposite sides of the gate electrode 11p. Then, the substrate 1 is heat-treated to diffuse the impurities therein. As a consequence, n$^+$-type semiconductive regions (source and drain) 16, each having a high impurity concentration, are formed in the p-type well 4. Whereas, p$^+$-type semiconductive regions (source and drain) 17, each having a high impurity concentration, are formed in the n-type well 5.

Then, as shown in FIG. 15, the gate insulating films 9a and 9b, that have been formed on top of the n$^+$-type semiconductive regions (source and drain) 16 and the p$^+$-type semiconductive regions (source and drain) 17, respectively, are removed by etching. Then, a cobalt (Co) film 18a is deposited on the substrate 1 by a sputtering method. Alternatively, a Ti (titanium) film may also be deposited in place of the cobalt film 18a.

Subsequently, by heat-treating the substrate 1, the cobalt film 18a is allowed to react with silicon (the substrate 1, and the gate electrodes 11n and 11p). Then, the unreacted cobalt film 18a is removed by wet etching. As a result, as shown in FIG. 16, cobalt silicide films 18 are formed on the respective surfaces of the n$^+$-type semiconductive regions (source and drain) 16, and the p$^+$-type semiconductive regions (source and drain) 17, and the gate electrodes 11n and 11p. By forming the cobalt silicide layers 18 on the surfaces of the gate electrodes 11n and 11p, the gate electrode 11n or 11p becomes a laminated film (polycide film) of the polycrystal silicon film (10n or 10p) and the cobalt silicide film 18.

Through the steps up to this point, the n-channel type MISFET ($Qn_1$) and the p-channel type MISFET ($Qp_1$) constituting the internal circuit, and the n-channel type MISFET ($Qn_2$) and the p-channel type MISFET ($Qp_2$) constituting the I/O circuit, are respectively completed.

Figure 17:
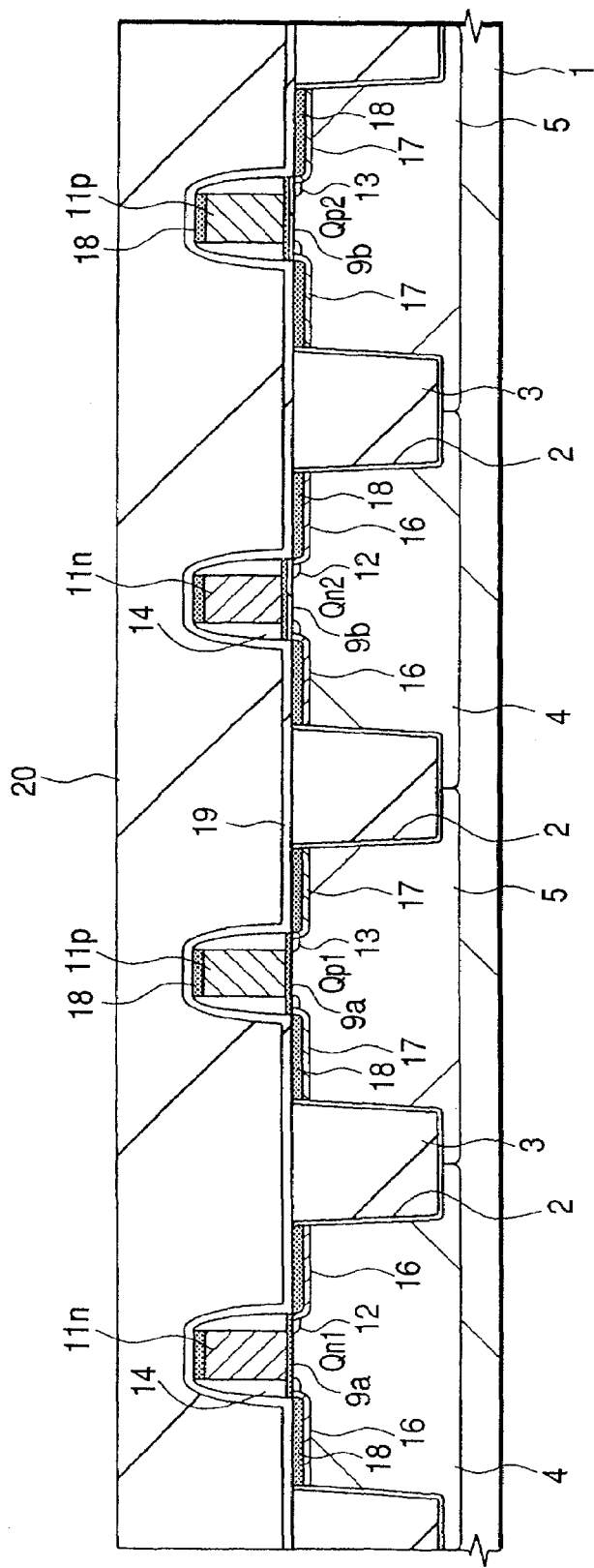
FIG. 17 is a cross-sectional view of a part of the semiconductor substrate, illustrating a subsequent step in the method of manufacturing the MISFET according to the one embodiment of the present invention.
Figure 18:
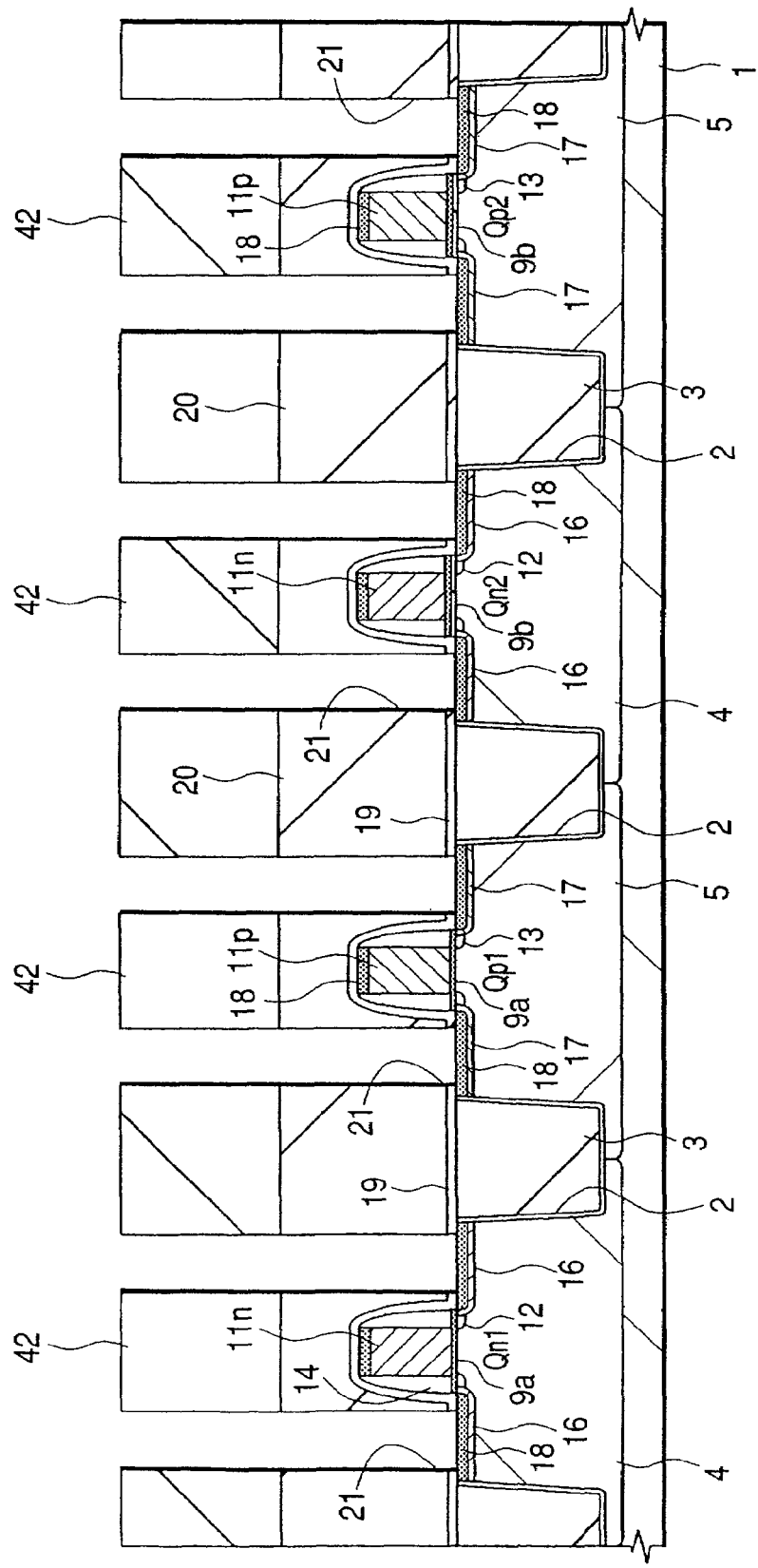
FIG. 18 is a cross-sectional view of a part of the semiconductor substrate, illustrating a subsequent step in the method of manufacturing the MISFET according to the one embodiment of the present invention.

Then, as shown in FIG. 17, a silicon nitride film 19 is deposited on the substrate 1 by a CVD method. Subsequently, a silicon dioxide film 20 is deposited on top of the silicon nitride film 19 by a CVD method. Then, as shown in FIG. 18, the silicon dioxide film 20 and the underlying silicon nitride film 19 are dry etched by using a photoresist film 42 formed on top of the silicon dioxide film 20 as a mask. As a consequence, contact holes 21 are respectively formed on top of the n$^+$-type semiconductive regions (source and drain) 16 and on top of the p$^+$-type semiconductive regions (source and drain) 17.

Figure 19:
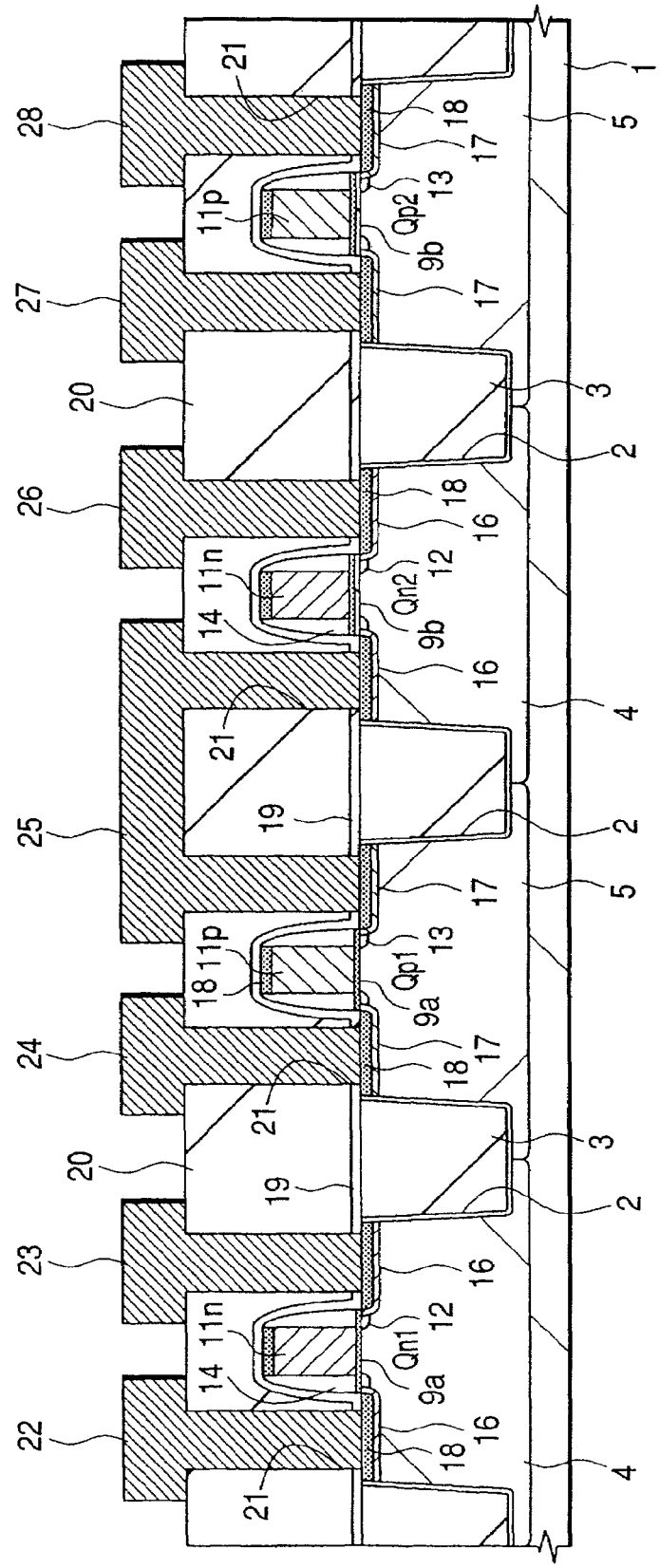
FIG. 19 is a cross-sectional view of a part of the semiconductor substrate, illustrating a subsequent step in the method of manufacturing the MISFET according to the one embodiment of the present invention.

Thereafter, the photoresist film 42 is removed. Then, as shown in FIG. 19, a tungsten (W) film is deposited on the silicon dioxide film 20, including the insides of the contact holes 21, by a CVD method or a sputtering method. Subsequently, the tungsten film is dry etched by using a photoresist film as a mask to form tungsten wires 22 to 28 on the silicon dioxide film 20.

Thereafter, multilayer wiring is formed on top of the tungsten wires 22 to 28 via an interlayer insulating film, but this is not shown.

Thus, in accordance with this embodiment, it is possible to prevent the mixing of impurities (foreign matter), such as carbon (C) contained in air, into the interface between the substrate 1 and the gate insulating films 9a and 9b. Further, it is possible to suppress the formation of an undesirable natural oxide film thereon. As a consequence, it is possible to ensure the compatibility between the suppression of the tunnel leakage currents of the MISFETs ($Qn_1$ and $Qp_1$) constituting the internal circuit and the attainment of the driving ability thereof. Further, by forming the gate insulating film 9b of the MISFETs ($Qn_2$ and $Qp_2$) constituting the I/O circuit by use of a laminated film of the silicon oxynitride film 8 and the high dielectric film 9, it is possible to ensure the reliability during high-voltage operation.

Embodiment 2

This embodiment demonstrates the case where the present invention is applied to a replacement gate type MISFET. The manufacturing steps thereof will be described with reference to FIGS. 20 to 29.

Figure 20:
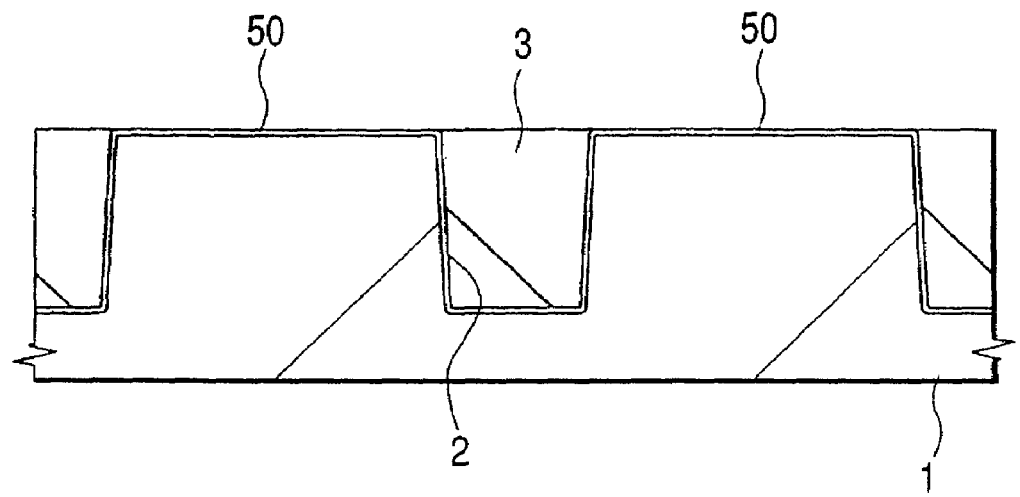
FIG. 20 is a cross-sectional view of a part of a semiconductor substrate, illustrating a subsequent step in a method of manufacturing a MISFET according to another embodiment of the present invention.

First, as shown in FIG. 20, an element isolation trench 2 is formed in a substrate 1 composed of p-type single-crystal silicon. Then, a silicon dioxide film 50 is deposited on the surface of the substrate 1 by a thermal oxidation method or a CVD method.

Figure 21:
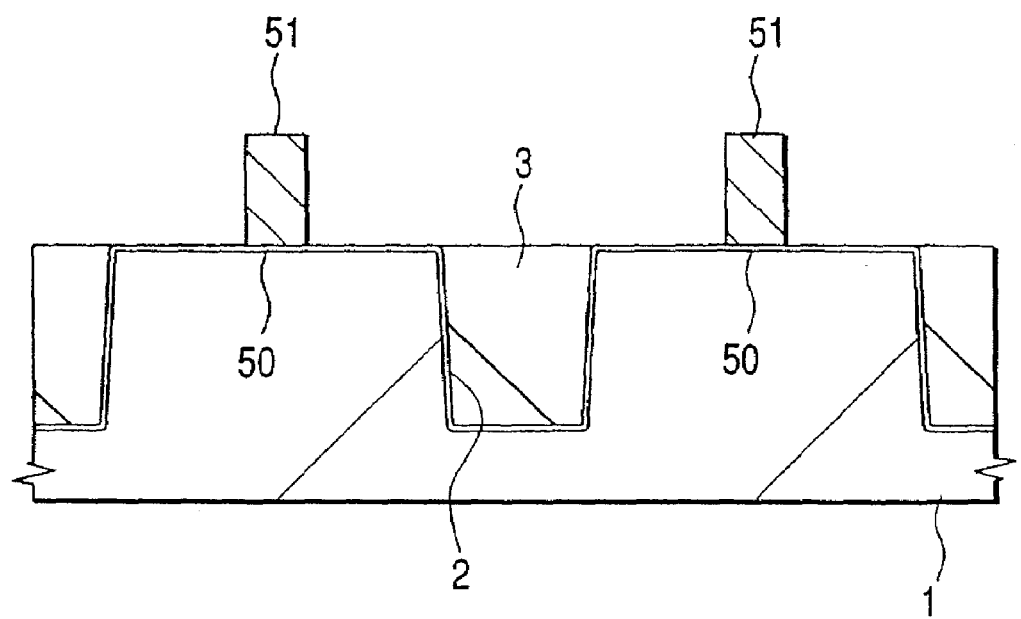
FIG. 21 is a cross-sectional view of a part of the semiconductor substrate, illustrating a subsequent step in the method of manufacturing the MISFET according to the other embodiment of the present invention.

Then, as shown in FIG. 21, for example, a non-doped polycrystal silicon film, that has been deposited on the substrate 1 by a CVD method, is patterned to form a dummy gate 51 in a region where a gate electrode will be formed.

Figure 22:
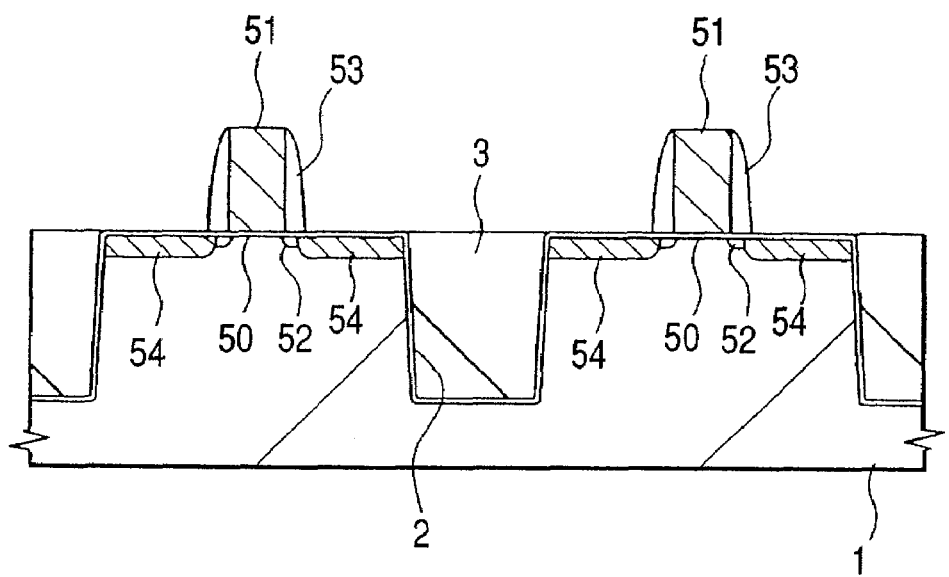
FIG. 22 is a cross-sectional view of a part of the semiconductor substrate, illustrating a subsequent step in the method of manufacturing the MISFET according to the other embodiment of the present invention.

Then, as shown in FIG. 22, n$^-$-type semiconductive regions 52, each with a low impurity concentration, are formed in the portions of the substrate 1 on the opposite sides of the dummy gate 51 by the ion-implantation of phosphorus. Subsequently, a sidewall spacer 53 made of silicon dioxide is formed on the sidewall of the dummy gate 51. Thereafter, n$^+$-type semiconductive regions (source and drain) 54, each with a high impurity concentration, are formed in the portions of the substrate 1 on the opposite sides of the dummy gate 51 by the ion-implantation of phosphorus.

Figure 23:
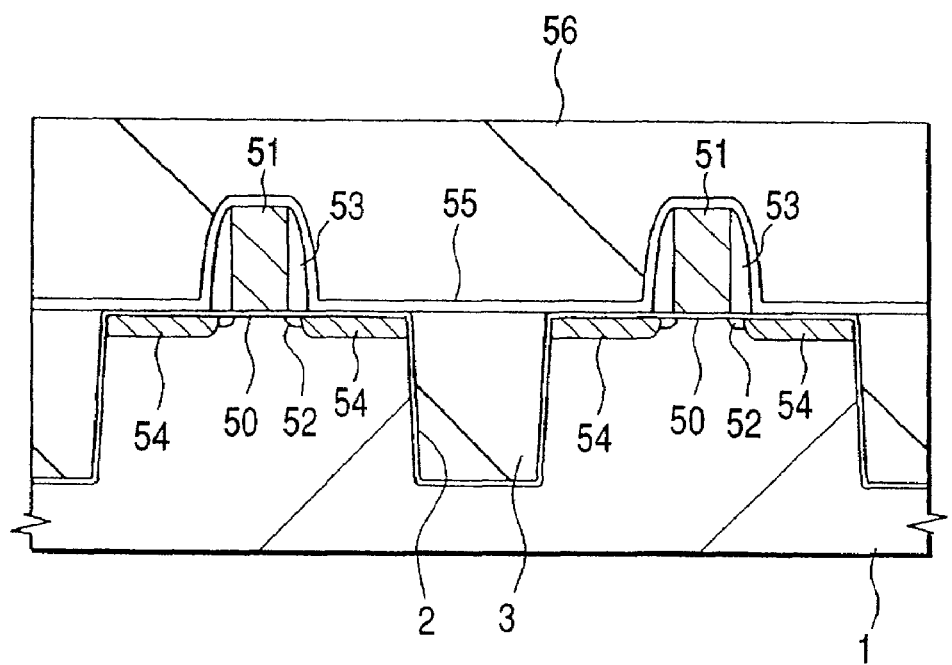
FIG. 23 is a cross-sectional view of a part of the semiconductor substrate, illustrating a subsequent step in the method of manufacturing the MISFET according to the other embodiment of the present invention.
Figure 24:
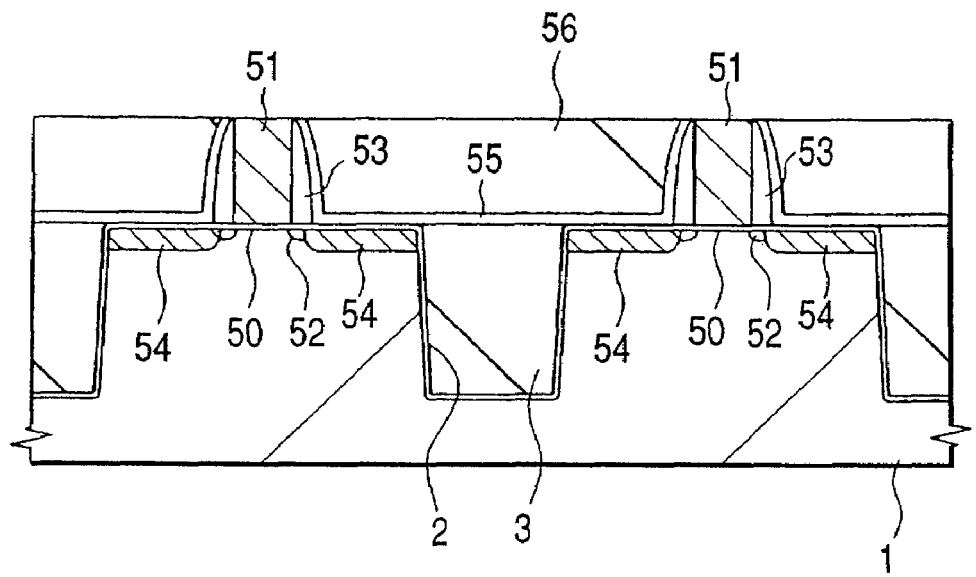
FIG. 24 is a cross-sectional view of a part of the semiconductor substrate, illustrating a subsequent step in the method of manufacturing the MISFET according to the other embodiment of the present invention.
Figure 25:
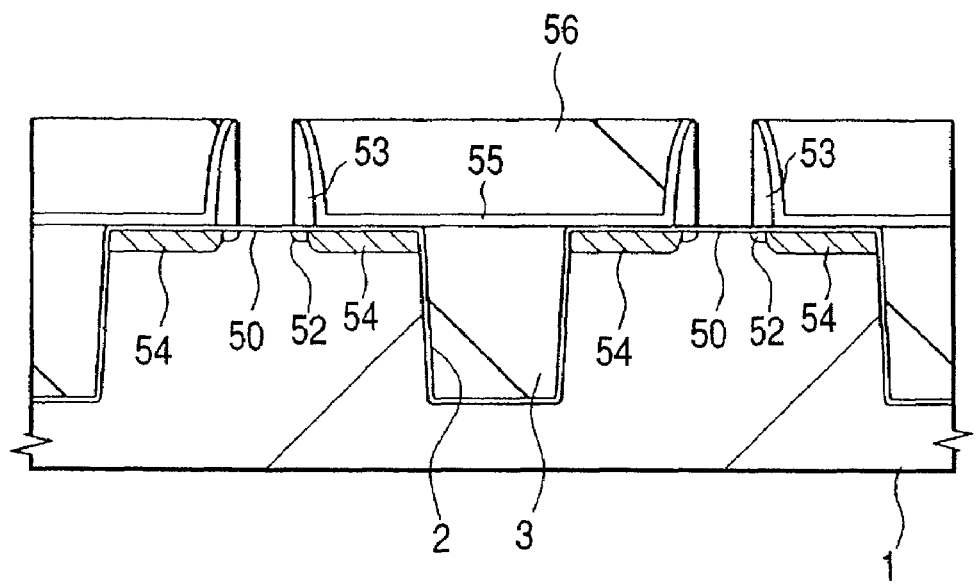
FIG. 25 is a cross-sectional view of a part of the semiconductor substrate, illustrating a subsequent step in the method of manufacturing the MISFET according to the other embodiment of the present invention.

Then, as shown in FIG. 23, a silicon nitride film 55 and a silicon dioxide film 56 are sequentially deposited on the substrate 1 by a CVD method. Then, as shown in FIG. 24, a part of the silicon dioxide film 56 and a part of the underlying silicon nitride film 55 are removed by a chemical mechanical polishing method. As a consequence, the top face of the dummy gate 51 is exposed. Subsequently, as shown in FIG. 25, the dummy gate 51 is removed by etching.

Figure 26:
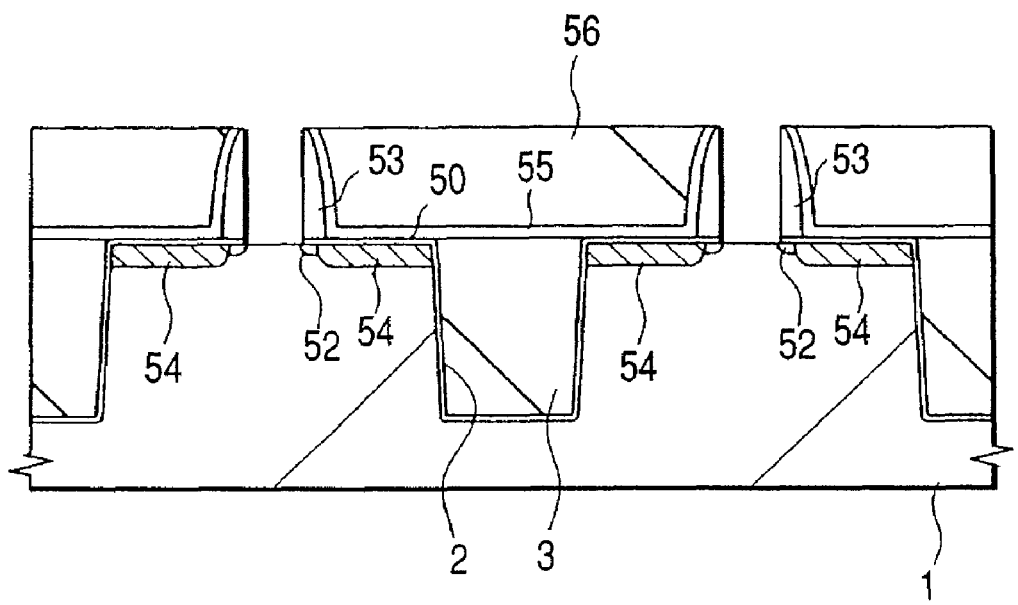
FIG. 26 is a cross-sectional view of a part of the semiconductor substrate, according to the method of manufacturing the MISFET according to the other embodiment of the present invention.

Then, the resulting substrate 1 is transported into the etching chamber 101 of the treatment apparatus 100 shown in FIG. 3. As shown in FIG. 26, the silicon dioxide film 50 is etched in the region exposed by removal of the dummy gate 51, so that the surface of the substrate 1 is exposed.

Figure 27:
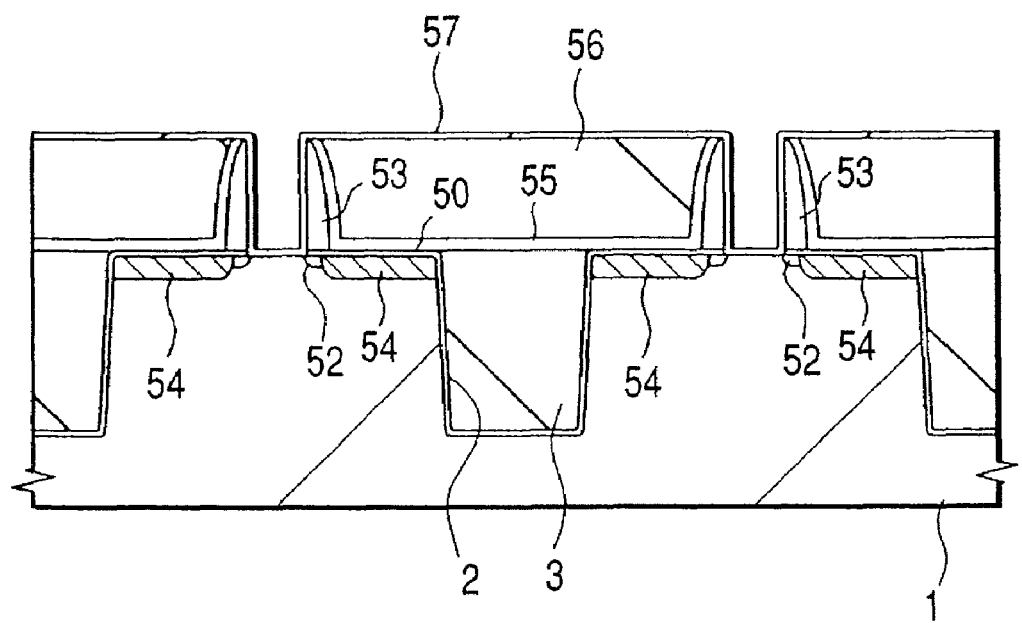
FIG. 27 is a cross-sectional view of a part of the semiconductor substrate, illustrating a subsequent step in the method of manufacturing the MISFET according to the other embodiment of the present invention.
Figure 28:
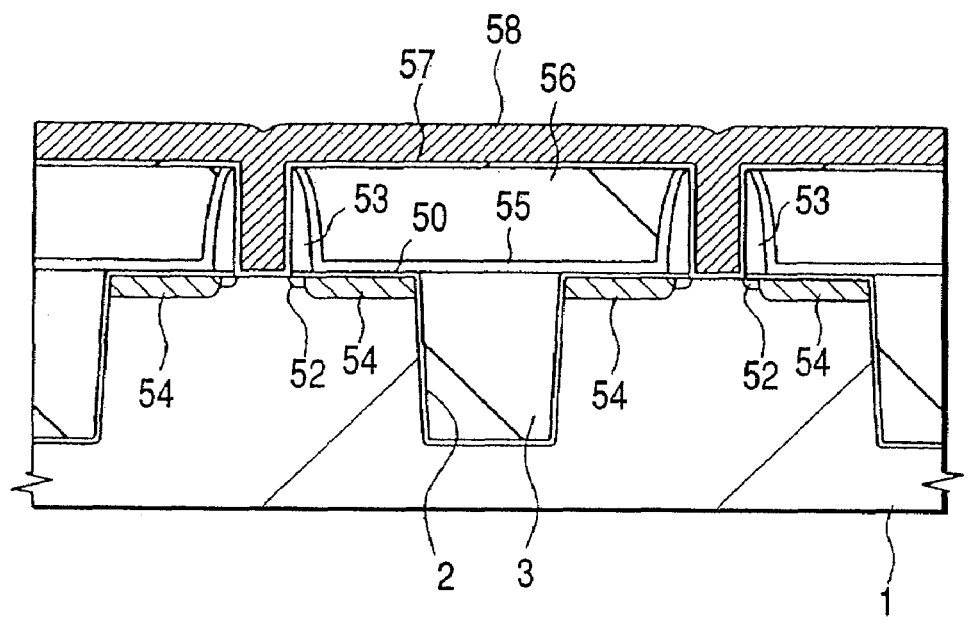
FIG. 28 is a cross-sectional view of a part of the semiconductor substrate, illustrating a subsequent step in the method of manufacturing the MISFET according to the other embodiment of the present invention.
Figure 29:
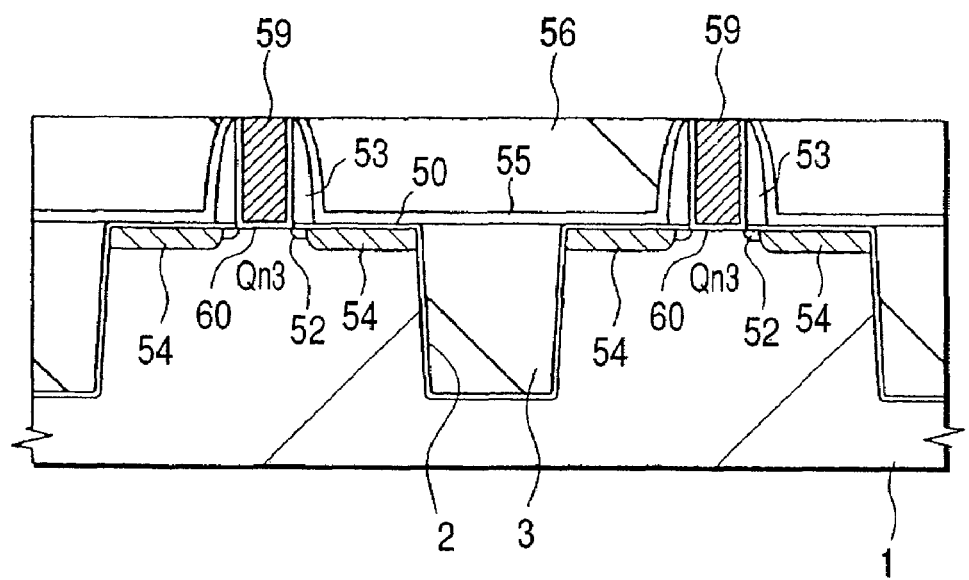
FIG. 29 is a cross-sectional view of a part of the semiconductor substrate, illustrating a subsequent step in the method of manufacturing the MISFET according to the other embodiment of the present invention.

Thereafter, the resulting substrate 1 is transported into the film-forming treatment chamber 105 of the treatment apparatus 100. As shown in FIG. 27, a high dielectric film 57 is deposited on the surface of the substrate 1 that has been exposed by the removal of the silicon dioxide film 50 and on the silicon dioxide film 56. Subsequently, as shown in FIG. 28, a W film 58 is deposited on top of the high dielectric film 57.

Then, the resulting substrate 1 is transported out from the treatment apparatus 100. The W film and the high dielectric film 57 on top of the silicon dioxide film 56 are removed by a chemical mechanical polishing method. As a consequence, a gate electrode 59 composed of the W film 58 is formed, and a gate insulating film 60 composed of the high dielectric film 57 is formed on the sidewall and the bottom of the gate electrode 59. Through the steps up to this point, an n-channel type MISFET $Qn_3$ is formed on the substrate 1.

Thus, the steps from the removal of the silicon dioxide film 50 to the deposition of the W film 58 are continuously carried out in the treatment apparatus 100. As a consequence, it is possible to suppress the defects that result in an undesirable natural oxide film being formed at the interface between the substrate 1 and the gate insulating film 60, and that result in foreign matter being deposited thereon.

Up to this point, the present invention has been specifically described by way of various embodiments, which should not be construed as limiting the scope of the present invention. It is needless to say that various changes and modifications may be made without departing from the scope of the invention.

In the foregoing embodiments, a description was given of a case where each gate insulating film of the MISFETs constituting the internal circuit is formed of a high dielectric film, and each gate insulating film of the MISFETs constituting the I/O circuit is formed of a laminated film of a silicon dioxide film (or a silicon oxynitride film) and a high dielectric film. However, the present invention is not limited thereto. It can be widely applied to a process in which each gate insulating film of a part of MISFETs is formed of a high dielectric film, and each gate insulating film of another part of the MISFETs is formed of a laminated film of a silicon dioxide film (or a silicon oxynitride film) and a high dielectric film.

Further, the present invention can also be applied to the case where a clean room wholly filled with an inert atmosphere is employed in place of the treatment apparatus 100 of the foregoing embodiments. In this case, the transport system and the loader/unloader units are filled with an inert atmosphere.

The effects obtainable in accordance with typical aspects of the present invention as disclosed in this application will be briefly described as follows.

In a process in which a part of the gate insulating film is formed of a high dielectric film and another part thereof is formed of a silicon dioxide film, it is possible to suppress the inclusion of undesirable foreign matter into the interface between the semiconductor substrate and the gate insulating film, and the formation of an undesirable natural oxide film thereon. Therefore, it is possible to ensure the compatibility between the suppression of the tunnel leakage current and the attainment of the driving ability of MISFETs.

What is claimed is:

1. A semiconductor device comprising:
   a semiconductor substrate; and
   a first MISFET and a second MISFET formed over the substrate,
   the first MISFET having a first gate insulating film and a first gate electrode formed over the first gate insulating film,
   the second MISFET having a second gate insulating film and a second gate electrode formed over the second gate insulating film,
   wherein a thickness of the second gate insulating film is greater than a thickness of the first gate insulating film,
   wherein the second gate insulating film includes a first insulating film formed over the semiconductor substrate and a second insulating film formed between the first insulating film and the second gate electrode,
   wherein the second insulating film includes hafnium and oxygen and has a dielectric constant larger than that of the first insulating film,
   wherein the first insulating film includes a silicon oxide film subjected to a nitriding treatment,
   wherein the first gate insulating film includes the second insulating film formed between the semiconductor substrate and the first gate electrode, and
   wherein each of the first gate electrode and the second gate electrode includes a refractory metal film.

2. A semiconductor device according to claim 1,
   wherein a first side spacer is formed on a side surface of the first gate electrode and includes a silicon nitride film, and
   wherein a second side spacer is formed on a side surface of the second gate electrode and includes a silicon nitride film.

3. A semiconductor device according to claim 1,
   wherein the second insulating film is subjected to a nitriding treatment.

4. A semiconductor device according to claim 1,
   wherein a third insulating film is formed between the semiconductor substrate and the second insulating film, and
   wherein the third insulating film is formed by oxidizing the substrate.

5. A semiconductor device according to claim 4, wherein the thickness of the first insulating film is greater than the thickness of the third insulating film.

6. A semiconductor device according to claim 1,
   wherein the refractory metal film is a tungsten film.

7. A semiconductor device comprising:
   a semiconductor substrate; and
   a first MISFET and a second MISFET formed over the substrate,
   the first MISFET having a first gate insulating film and a first gate electrode formed over the first gate insulating film,
   the second MISFET having a second gate insulating film and a second gate electrode formed over the second gate insulating film,
   an interlayer insulating film formed over the first MISFET and the second MISFET and having a plurality of grooves,
   wherein a thickness of the second gate insulating film is greater than a thickness of the first gate insulating film,
   wherein the second gate insulating film includes a first insulating film formed over the semiconductor substrate and a second insulating film formed between the first insulating film and the second gate electrode,
   wherein the second insulating film includes hafnium and oxygen and has a dielectric constant larger than that of the first insulating film,
   wherein the first insulating film includes a silicon oxide film subjected to a nitriding treatment, wherein the first gate insulating film includes the second insulating film formed between the semiconductor substrate and the first gate electrode, wherein the second insulating films of the first MISFET and the second MISFET are formed over the side wall of the grooves and over the semiconductor substrate, providing grooves of the second insulating films, and wherein each of the first gate electrode and the second gate electrode includes a refractory metal film and is embedded into the grooves of the second insulating films.

8. A semiconductor device according to claim 7, wherein a first side spacer is provided on a side surface of the first gate electrode and includes a silicon nitride film, and wherein a second side spacer is provided on a side surface of the second gate electrode and includes a silicon nitride film.

9. A semiconductor device according to claim 7, wherein the second insulating film is subjected to a nitriding treatment.

10. A semiconductor device according to claim 7, wherein a third insulating film is formed between the semiconductor substrate and the second insulating film, and wherein the third insulating film is formed by oxidizing the substrate.

11. A semiconductor device according to claim 10, wherein the thickness of the first insulating film is greater than the thickness of the third insulating film.

12. A semiconductor device according to claim 7, wherein the refractory metal film is a tungsten film.

* * * * *